US012368061B1

(12) United States Patent
Iyengar et al.

(10) Patent No.: US 12,368,061 B1
(45) Date of Patent: Jul. 22, 2025

(54) THROUGHPUT IMPROVEMENTS FOR LOW-TEMPERATURE/BEOL-COMPATIBLE HIGHLY SCALABLE GRAPHENE SYNTHESIS METHODS INCLUDING PROCESSING IN RETASKED TOOLS

(71) Applicant: Destination 2D Inc., Milpitas, CA (US)

(72) Inventors: Ravi Iyengar, Milpitas, CA (US);
Kaustav Banerjee, Goleta, CA (US);
Brian Cronquist, Klamath Falls, OR (US)

(73) Assignee: Destination 2D Inc., San Jose, CA (US)

( * ) Notice: Subject to any disclaimer, the term of this patent is extended or adjusted under 35 U.S.C. 154(b) by 0 days.

(21) Appl. No.: 19/000,144

(22) Filed: Dec. 23, 2024

Related U.S. Application Data

(63) Continuation of application No. 18/780,387, filed on Jul. 22, 2024.

(51) Int. Cl.
*H01L 21/67* (2006.01)
*H01L 21/02* (2006.01)

(52) U.S. Cl.
CPC .. *H01L 21/67092* (2013.01); *H01L 21/02115* (2013.01); *H01L 21/02304* (2013.01)

(58) Field of Classification Search
CPC ......... H01L 21/67092; H01L 21/02115; H01L 21/02304; H01L 21/7813; B32B 37/025; B32B 2457/14

(Continued)

(56) References Cited

U.S. PATENT DOCUMENTS 8,501,531 B2 * 8/2013 Kub ...................... H01L 29/475
257/E21.295
9,129,811 B2 * 9/2015 Cho ...................... H01L 21/0262
(Continued)

FOREIGN PATENT DOCUMENTS

CN 105668559 A 6/2016

OTHER PUBLICATIONS

Banerjee, et al., U.S. Appl. No. 18/674,085 titled Low-Temperature/Beol-Compatible Highly Scalable Graphene Synthesis Tools Including Retasked Tools, filed May 24, 2024, 40 pages.
(Continued)

*Primary Examiner* — Vu A Vu
(74) *Attorney, Agent, or Firm* — Womble Bond Dickinson (US) LLP

(57) ABSTRACT

A diffusion-couple synthesis method using a graphene synthesis tool (GST) including: providing a substrate-load (SL) which includes first-preparedsubstrate (fPS) and second-prepared-substrate (sPS), where fPS includes a first-carbon-source (fCS), a first-sacrificial-diffusion layer (fSDL), and a first-device-level (fDL), where a first-dielectric-layer (fDiLy) is disposed atop fDL, where fSDL is disposed directly atop fDiLy, where fCS is disposed directly atop the fSDL, and where the sPS includes a secondCS, a secondSDL, and a secondDL, where secondDL is disposed atop the secondDL, where the secondSDL is disposed atop secondDiLy, where secondCS is disposed atop secondSDL; providing a GST capable of applying pressure and temperature to SL within a process chamber (PC); placing SL within PC; applying the pressure and the temperature to SL, where sPS is inverted and disposed above fPS, where fCS is in direct contact with secondCS; forming graphene at a first interface between the fDiLy and the fSDL and at a second interface between secondDiLy and secondSDL.

19 Claims, 18 Drawing Sheets

(58) Field of Classification Search
USPC .......................................................... 438/455
See application file for complete search history.

(56) References Cited

U.S. PATENT DOCUMENTS

| | | | |
|---|---|---|---|
| 9,206,509 B2* | 12/2015 | Baraton | C23C 16/0281 |
| 9,236,432 B2* | 1/2016 | Kub | H01L 29/2003 |
| 9,327,982 B2* | 5/2016 | Kub | H01L 29/78684 |
| 10,950,706 B2* | 3/2021 | Birmingham | H02J 3/38 |
| 11,244,816 B2* | 2/2022 | Birmingham | H10N 10/852 |
| 11,976,369 B2 | 5/2024 | Banerjee | |
| 12,170,248 B2 | 12/2024 | Schuegraf | |
| 2023/0008834 A1* | 1/2023 | Banerjee | C23C 16/26 |
| 2023/0105855 A1* | 4/2023 | Banerjee | C01B 32/186 |
| | | | 427/8 |
| 2024/0014071 A1* | 1/2024 | Banerjee | H01L 21/76802 |
| 2024/0258118 A1 | 8/2024 | Banerjee | |
| 2024/0295018 A1 | 9/2024 | Banerjee | |
| 2024/0339407 A1 | 10/2024 | Schuegraf | |

OTHER PUBLICATIONS

Banerjee, et al., U.S. Appl. No. 63/441,766 titled Large-Area/Wafer-Scale CMOS-Compatible 2D-Material Doping Tools, Processes, and Methods, Including Doping of Synthesized Graphene, filed Jan. 27, 2023, 31 pages.

Schuegraf, U.S. Appl. No. 63/457,362 titled Graphene Beol Integration Techniques, Methods, Structures, and Devices, filed Apr. 5, 2023, 21 pages.

Silvetti, et al., U.S. Appl. No. 63/620,748 titled Additional Utility of a Graphene Synthesis Tool, filed Jan. 12, 2024, 30 pages.

Banerjee, et al., U.S. Appl. No. 63/218,498 titled Wafer-Scale CMOS-Compatible Graphene Synthesis Tool, filed Jul. 6, 2021, 22 pages.

Banerjee, U.S. Appl. No. 63/618,862 titled Techniques, Methods, and Structures for Rapid and Efficient Intercalation-Doping of Large-Area Multi-Layered Graphene Sheets for Transparent Conductor Applications, Including Solar Cells and Displays, filed Jan. 8, 2024, 22 pages.

Banerjee, et al., U.S. Appl. No. 18/744,533 titled Techniques, Methods, and Structures for Rapid and Efficient Intercalation-Doping of Large-Area Multi-Layered Graphene Sheets for Transparent Conductor Applications, Including Solar Cells and Displays, filed Jun. 14, 2024, 118 pages.

Iyengar, et al., U.S. Appl. No. 18/780,387 titled Throughput Improvements for Low-Temperature/Beol-Compatible Highly Scalable Graphene Synthesis Methods Including Processing in Retasked Tools, filed Jul. 22, 2024, 86 pages.

Jiang, et al., Intercalation doped multilayer-graphene-nanoribbons for next-generation interconnects, Nano letters, Mar. 8, 2017, pp. 1482-1488, vol. 17, No. 3.

Jiang, et al., CMOS-Compatible Doped-Multilayer-Graphene Interconnects for Next-Generation VLSI, International Electron Devices Meeting (IEDM), Dec. 1, 2018, pp. 34-35.

Non-Final Rejection dated Nov. 4, 2024 in parent U.S. Appl. No. 18/780,387, filed Jul. 22, 2024, 8 pages.

Requirement for Restriction/Election dated Oct. 10, 2024 in parent U.S. Appl. No. 18/780,387, filed Jul. 22, 2024, 7 pages.

* cited by examiner

THROUGHPUT IMPROVEMENTS FOR LOW-TEMPERATURE/BEOL-COMPATIBLE HIGHLY SCALABLE GRAPHENE SYNTHESIS METHODS INCLUDING PROCESSING IN RETASKED TOOLS

CROSS-REFERENCE OF RELATED APPLICATIONS

This application references U.S. patent application Ser. No. 18/674,085, filed on 24-5-2024, and titled LOW-TEMPERATURE/BEOL-COMPATIBLE HIGHLY SCALABLE GRAPHENE SYNTHESIS TOOLS INCLUDING RETASKED TOOLS; U.S. patent application Ser. No. 18/655,087, filed on 3 May 2024, and titled LOW-TEMPERATURE/BEOL-COMPATIBLE HIGHLY SCALABLE GRAPHENE SYNTHESIS TOOL; U.S. patent application Ser. No. 18/607,380, filed on 15 Mar. 2024, and titled GRAPHENE BEOL INTEGRATION INTERCONNECTION STRUCTURES; U.S. patent application Ser. No. 18/527,043, filed on 1 Dec. 2023, and titled LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE; U.S. patent application Ser. No. 17/863,232, filed on 12 Jul. 2022, and titled LOW-TEMPERATURE/BEOL-COMPATIBLE HIGHLY SCALABLE GRAPHENE SYNTHESIS TOOL; U.S. patent application Ser. No. 17/857,954, filed on 5 Jul. 2022, and titled LOW-TEMPERATURE/BEOL-COMPATIBLE HIGHLY SCALABLE GRAPHENE SYNTHESIS TOOL; U.S. Provisional Patent Application No. 63/441,766, filed on 27 Jan. 2023, and titled LARGE-AREA/WAFER-SCALE CMOS-COMPATIBLE 2D-MATERIAL DOPING TOOLS, PROCESSES, AND METHODS, INCLUDING DOPING OF SYNTHESIZED GRAPHENE; U.S. Provisional Patent Application No. 63/457,362, filed on 5 Apr. 2023, and titled GRAPHENE BEOL INTEGRATION TECHNIQUES, METHODS, STRUCTURES, AND DEVICES; U.S. Provisional Patent Application No. 63/620,748, filed on 12 Jan. 2024, and titled ADDITIONAL UTILITY OF A GRAPHENE SYNTHESIS TOOL; and U.S. Provisional Patent Application No. 63/218,498, filed on 6 Jul. 2021, and titled WAFER-SCALE CMOS-COMPATIBLE GRAPHENE SYNTHESIS TOOL; as related applications, the entire contents of the foregoing applications are hereby incorporated herein by reference.

Furthermore, this application references U.S. Provisional Patent Application No. 63/618,862, filed on 8 Jan. 2024, and titled TECHNIQUES, METHODS, AND STRUCTURES FOR RAPID AND EFFICIENT INTERCALATION-DOPING OF LARGE-AREA MULTI-LAYERED GRAPHENE SHEETS FOR TRANSPARENT CONDUCTOR APPLICATIONS, INCLUDING SOLAR CELLS AND DISPLAYS; and U.S. patent application Ser. No. 18/744,533, filed on 14 Jun. 2024, and titled TECHNIQUES, METHODS, AND STRUCTURES FOR RAPID AND EFFICIENT INTERCALATION-DOPING OF LARGE-AREA MULTI-LAYERED GRAPHENE SHEETS FOR TRANSPARENT CONDUCTOR APPLICATIONS, INCLUDING SOLAR CELLS AND DISPLAYS; as related applications, the entire contents of the foregoing applications are hereby incorporated herein by reference.

Moreover, this application claims priority to U.S. patent application Ser. No. 18/780,387, filed on 22 Jul. 2024, and titled THROUGHPUT IMPROVEMENTS FOR LOW-TEMPERATURE/BEOL-COMPATIBLE HIGHLY SCALABLE GRAPHENE SYNTHESIS METHODS INCLUDING PROCESSING IN RETASKED TOOLS; the entire contents of the foregoing application is hereby incorporated herein by reference.

BACKGROUND

Solid-phase diffusion of atoms in a "material stack" forming a "diffusion-couple" can be leveraged to synthesize high-quality thin-films at relatively low temperatures, needed in a wide range of applications covering microelectronics, optoelectronics, bioelectronics, quantum computing, and many more. However, enabling such solid-phase diffusion assisted thin-film growth; particularly over large "wafer-scale" (e.g. 150 mm, 200 mm, 300 mm, etc.) substrates, and within reasonable growth times, require design and fabrication of novel apparatus, or may utilize existing commercial (current or past) equipment with or without minor or major modifications, that can allow uniform application of a wide range of temperatures and pressures over the entire surface area of the semiconductor wafer or any other substrate forming the diffusion-couple. A core component of such an apparatus is a reactor that is not only capable of hosting such large area substrates but also allow a chemically purged environment, heated large-area substrates with near-zero temperature non-uniformity, as well as mechanisms to apply relatively large and uniform mechanical pressures (e.g., up to 1000 psi, etc.) to the diffusion-couple. It is noted that in some examples, atmospheric pressure can be utilized.

An imminent need for such a large-area diffusion-couple is in the emerging field of atomically-thin two-dimensional (2D) materials, particularly graphene or multi-layered-graphene (MLG) (essentially a single or multiple atomic layers of carbon atoms arranged in a hexagonal lattice), that must be directly synthesized over a desired substrate (typically a dielectric or a metal) without the need for a transfer-step that is considered unfeasible and cost-ineffective in the mainstream electronics (or CMOS) industry. Such graphene/MLG layers are preferred materials in several back-end-of-line or BEOL (refers to process steps in chip manufacturing after the formation of the active devices such as transistors and diodes) applications, particularly on-chip interconnects. However, BEOL interconnects must be synthesized under a strict thermal budget of <500° C. to avoid any damage to the underlying active devices (e.g. transistors, diodes, etc. via increased diffusion of impurities), and/or underlying interconnect layers and levels which may comprise materials, for example, such as Aluminum, Copper, Cobalt, Ruthenium, alloys of these, 2D materials, low dielectric constant (low-k) insulating materials, and such with low softening/diffusion temperatures, which may be compromised by exposure to temperatures above 500° C.

Recent advances in graphene/MLG synthesis at BEOL-compatible temperatures have brought to the forefront the utility of the diffusion-couple for graphene/MLG growth, where a layer of carbon-source (e.g. in the form of powder, slurry, or amorphous-carbon film, and such) deposited over a sacrificial metallic film (such as Nickel) lying over a SiO2/Si substrate forms the diffusion-couple. Application of appropriate mechanical pressure (65-85 psi) on the carbon source at a relatively low temperature (<450° C.) has been shown to be sufficient to allow high-quality graphene/MLG growth, albeit over relatively small (1-2 inches) substrates. Hence, to allow this technique to be integrated in the mainstream CMOS technology, a scaled up (150/200/300 mm) diffusion-couple apparatus needs to be designed and fabricated. This technique/apparatus is also extendable to a wide range of substrates of different geometries and configurations and to other applications that inherently require a low thermal budget (<500° C.).

In addition, utilization of pressure and temperature to synthesize large scale, single to multi-layer graphene is presented in this invention via use of hardware which applies both temperature and pressure simultaneously to a given carbon-source-material, metal based multilayer stack.

Key components of hardware may include at least one mechanical pressure head and at least one heater (integrated within the process/reactor chamber or within the pressure heads) to raise the temperature of a substrate above room temperature.

Commercially available tools, for example, such as, wafer bonding tools, hot-press based isostatic sintering systems, hot isostatic press (HIP), hot pressure vessels, and similar can be utilized.

A key value statistic of the machines used in the production of semiconductor circuits is throughput, the ability of a machine & process performed on that machine to produce a specific number of wafers/substrates thru the process of interest in a specific time period; usually dimensioned as wafers/hour. Since device manufacturing is a high capital asset value business, capital asset depreciation is crucial to determining the breakeven of a specific facility, equipment base, and a specific process run on those machines. Depreciation in tax rules s generally time-based, so the profitable manufacturer pushes thru as much saleable material/product as possible in a given unit of time, thus throughput.

This disclosure and teaching describe novel and non-obvious methods and apparatuses to increase the throughput of the machines which could be used to create graphene layers and levels for at least semiconductor devices, solar cells, optoelectronic devices, antennas, and more.

SUMMARY OF THE INVENTION

In one aspect, a diffusion-couple synthesis method using a graphene synthesis tool, the method including: providing a substrate load, where the substrate load includes at least a first prepared substrate and a second prepared substrate, where the first prepared substrate includes a first carbon source, a first sacrificial diffusion layer, and a first device level, where a first dielectric layer is disposed atop the first device level, where the first device level includes first transistors, where the first sacrificial diffusion layer is disposed directly atop the first dielectric layer, where the first carbon source is disposed directly atop the first sacrificial diffusion layer, and where the second prepared substrate includes a second carbon source, a second sacrificial diffusion layer, and a second device level, where a second dielectric layer is disposed atop the second device level, where the second device level includes second transistors, where the second sacrificial diffusion layer is disposed directly atop the second dielectric layer, where the second carbon source is disposed directly atop the second sacrificial diffusion layer; providing a graphene synthesis tool, where the graphene synthesis tool is capable of applying pressure and temperature to the substrate load within a process chamber; placing the substrate load within the process chamber; applying the pressure and the temperature to the substrate load, where the second prepared substrate is inverted and disposed above the first prepared substrate, where the first carbon source is in direct contact with the second carbon source; and forming graphene at a first interface between the first dielectric layer and the first sacrificial diffusion layer and at a second interface between the second dielectric layer and the second sacrificial diffusion layer, where first carbon of the first carbon source diffuses in a net opposite direction to second carbon of the second carbon source.

In another aspect, a diffusion-couple synthesis method using a graphene synthesis tool, the method including: providing a substrate load, where the substrate load includes at least a first prepared substrate and a second prepared substrate, where the first prepared substrate includes a first carbon source, a first sacrificial diffusion layer, and a first device level, where a first dielectric layer is disposed atop the first device level, where the first device level includes first transistors, where the first sacrificial diffusion layer is disposed directly atop the first dielectric layer, where the first carbon source is disposed directly atop the first sacrificial diffusion layer, and where the second prepared substrate includes a second sacrificial diffusion layer and a second device level, where a second dielectric layer is disposed atop the second device level, where the second device level includes second transistors, where the second sacrificial diffusion layer is disposed directly atop the second dielectric layer; providing a graphene synthesis tool, where the graphene synthesis tool is capable of applying pressure and temperature to the substrate load within a process chamber; placing the substrate load within the process chamber; applying the pressure and the temperature to the substrate load, where the second prepared substrate is inverted and disposed above the first prepared substrate, where the first carbon source is in direct contact with the second sacrificial diffusion layer; and forming graphene at a first interface between the first dielectric layer and the first sacrificial diffusion layer and at a second interface between the second dielectric layer and the second sacrificial diffusion layer, where carbon of the first carbon source diffuses in a first net direction towards the first interface and in a second net direction towards the second interface.

And in another aspect, a diffusion-couple synthesis method using a graphene synthesis tool, the method including: providing a substrate load, where the substrate load includes a prepared substrate; providing a graphene synthesis tool, where the graphene synthesis tool is capable of applying pressure and temperature to the substrate load within a process chamber; placing the substrate load within the process chamber; applying the pressure and the temperature to the substrate load, where the prepared substrate includes a diffusion layer and a device level, where a dielectric layer is disposed atop the device level, where the diffusion layer is disposed directly atop the dielectric layer, where a single layer of carbon source is disposed directly atop the diffusion layer of the prepared substrate, where the single layer of carbon source is in direct contact with the sacrificial diffusion layer of the prepared substrate; and forming graphene at an interface between the dielectric layer and the diffusion layer of the prepared substrate.

BRIEF DESCRIPTION OF THE DRAWINGS

The present application can be best understood by reference to the following description taken in conjunction with the accompanying figures, in which like parts may be referred to by like numerals.

Figure 1:
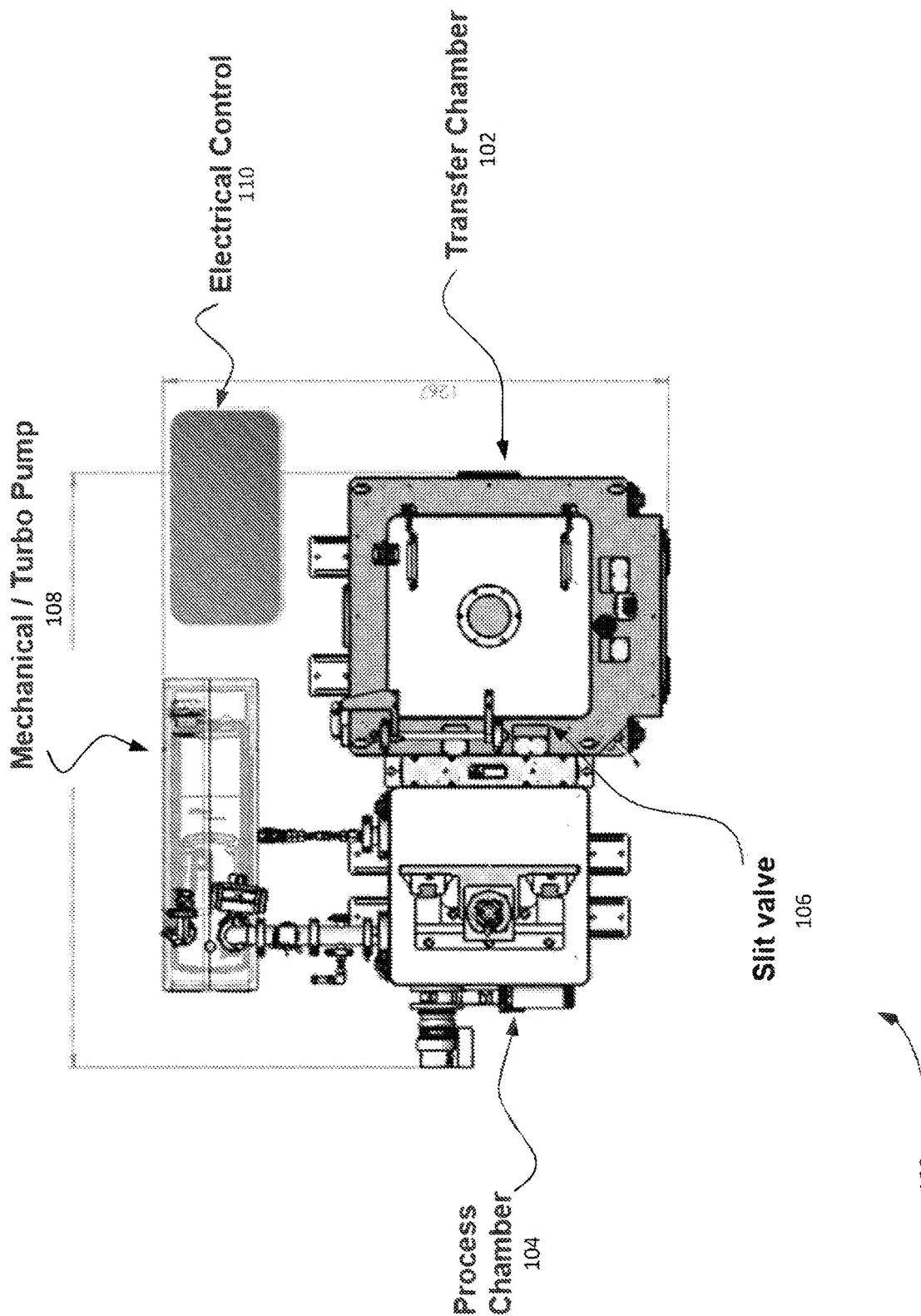
FIG. 1 illustrates an example top-view of the graphene process and transfer chambers of a graphene synthesis tool, according to some embodiments.

The Figures described above are a representative set and are not exhaustive with respect to embodying the invention.

DESCRIPTION

Disclosed are a system, method, and article of manufacture for low-temperature/BEOL-compatible highly scalable graphene synthesis tool. In addition, commercially available tools such as wafer bonding tools, hot-press based isostatic sintering systems, hot isostatic press (HIP), hot pressure vessels, and the like may be utilized. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The terms monocrystalline or mono-crystalline in the use herein of, for example, monocrystalline or mono-crystalline layer, material, or silicon, may be defined as "a single crystal body of crystalline material that contains no large-angle boundaries or twin boundaries as in ASTM F1241, also called monocrystal" and "an arrangement of atoms in a solid that has perfect periodicity (that is, no defects)" as in the SEMATECH dictionary. The terms single crystal and monocrystal are equivalent in the SEMATECH dictionary. The term single crystal in the use herein of, for example, single crystal silicon layer, single crystal layer, may be equivalently defined as monocrystalline.

The term via in the use herein may be defined as "an opening in the dielectric layer(s) through which a riser passes, or in which the walls are made conductive; an area that provides an electrical pathway [connection path] from one metal layer to the metal layer above or below," as in the SEMATECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

Definitions

Back-End-Of-Line (BEOL) is the second portion of IC fabrication process where interconnects and other circuit elements are formed between and over the individual devices (primarily the transistors) on the wafer (e.g., the metallization layers) separated by intra-layer and/or inter-layer insulators.

Complementary metal-oxide-semiconductor (CMOS) is a type of metal-oxide-semiconductor field-effect transistor (MOSFET) fabrication process that uses complementary and many times electrically symmetrical pairs of p-type and n-type MOSFETs for implementing at least logic functions.

Grain boundary (GB) is the interface between two grains and/or crystallites in a polycrystalline material.

Graphene is an allotrope of carbon consisting of a single layer of atoms arranged in a two-dimensional honeycomb lattice.

Graphene nanoribbons (GNRs) are strips of graphene with a width less than about one-hundred (100) nm.

Graphite is a layered crystalline form of the element carbon with its atoms arranged and covalently bonded forming a hexagonal structure within the layers.

Intercalation doping: Intercalation is when a molecule or ion inserts reversibly between the layers of a compound (such as potassium ions between graphite layers). Doping is adding impurities into a material. The dopant (impurity ion) will incorporate into the material's lattice. N-type dopants will donate electrons to the material. P-type dopants will accept electrons from the material. This will change the charge carrier density and consequently the electronic properties of the material.

Intercalation doping agents: There are many in the literature. Specific to graphene is recent work by Kaustav Banerjee, et al.; for example, J. Jiang, Jae Hwan Chu, and Kaustav Banerjee, "CMOS-Compatible Doped-Multilayer-Graphene Interconnects for Next-Generation VLSI," IEDM 2018, pp. 799-802, 34.5.1-4; and J. Jiang, et al., "Intercalation doped multilayer-graphene-nanoribbons for next-generation interconnects," Nano Letters, vol. 17, no. 3, pp. 1482-1488, 2017.

Piezoelectricity is the electric charge that accumulates in certain solid materials in response to applied mechanical stress.

Resistance temperature detectors (RTDs) are sensors used to measure temperature by monitoring the change in the electrical resistance of a conductor with temperature. RTD elements can consist of a length of fine wire wrapped around a heat-resistant ceramic or glass core but other constructions are also used.

Silicon dioxide is an oxide of silicon and an insulator with the chemical formula $SiO_2$.

Wafer is a thin slice of semiconductor (e.g., a crystalline silicon, germanium) used for the fabrication of integrated circuits, etc.

Example Low-Temperature/BEOL-Compatible Highly Scalable Graphene Synthesis Tool

It is noted that the following example embodiments discuss a graphene source by way of example. However, other carbon-sources (including carbon carrying compounds) can be utilized in other example embodiments.

FIG. 1 illustrates an example top-view of the graphene process and transfer chambers of a carbon-source synthesis tool 100, according to some embodiments. It is noted that in other example embodiments, other diffusion materials (other elements in the periodic table suitable for a specific diffusion metal and application) than carbon-sources can be utilized. Carbon-source synthesis tool 100 can be a low-temperature/BEOL-compatible scalable graphene (and/or other carbon source) synthesis tool. Carbon-source synthesis tool 100 includes transfer chamber 102. Transfer chamber 102 is used to load the wafer/substrate. The wafer/substrate can be of various sizes (e.g. 300 mm, 200 mm, 150 mm, etc.). An operator/user can place the wafer/substrate in transfer chamber 102. The transfer chamber 102 is then closed and sealed. The pressure of the transfer chamber 102 is equalized with the pressure of the process chamber 104. Once the pressure is equalized, the wafer/substrate is then pushed to the process chamber 104. It is noted that the wafer/substrate can be returned to the transfer chamber 102 after implementation of the deposition and other fabrication methods.

It is noted that some process schemes involve two or more wafers/substrates per position (i.e. one wafer/substrate on top of the other on top of another and so on, generally (but not necessarily) with the active 'top' of the wafer/substrate facing outwards, towards each platen/disk) in the apparatus, where the heat and compression acceleration can be applied to the two or more wafers/substrates simultaneously and thus synthesize the graphene on all of the wafers/substrates.

The process chamber 104 and the transfer chamber 102 are connected via a slit valve 108. Slit valve 108 may be opened once the pressures inside the two chambers are equalized.

The process chamber 104 is the main chamber (or reactor) for growth of graphene (and/or other carbon material) on the wafer and/or the application of temperature and pressure to form the diffusion-couple and ultimately high-quality graphene at the desired surface. A slightly larger than 300 mm sized substrate is located in the process chamber 104 (e.g. see heated bottom substrate 208). Process chamber 104 is equipped with a heater system. A heated top plate or disk is located in the process chamber 104 as well (e.g. see heated top substrate 206). The heated top disk has its own heating mechanism as well (e.g. see heating power supply 202). In this way, both the lower disk on which the wafer is placed and the heated top disk can be heated independently or synchronously. For example, the lower disk can be heated and the top disk can be kept at approximately room temperature (or vice versa). The liner surfaces (covering the disks) can be made of graphite, though other materials such as aluminum nitride, quartz, silicon carbide coated graphite, etc. can be employed. Several such materials are possible-generally speaking materials which permit good heat transfer and distribution of pressure can be considered. Flatness and surface finish of the liner can be a key factor to ensure appropriate heat and pressure distribution.

Mechanical/turbo pump 108 can be used to control pressure in process chamber 104 and/or transfer chamber 102. Mechanical pump(s) can be used to lower pressure in process chamber 104 (e.g. $10^{-3}$ torr). The turbo pump can be a more powerful pump that is used to lower the pressure even further (e.g. $10^{-7}$ torr). Low pressure is desired to purge the chamber of any impurities during the operation of the diffusion-couple.

Electrical control 110 can be used to operate carbon-source synthesis tool 100. Electrical control 110 can include computer processor(s) and software systems. Users can input commands, view status of various operations of carbon-source synthesis tool 100, etc.

Figure 2:
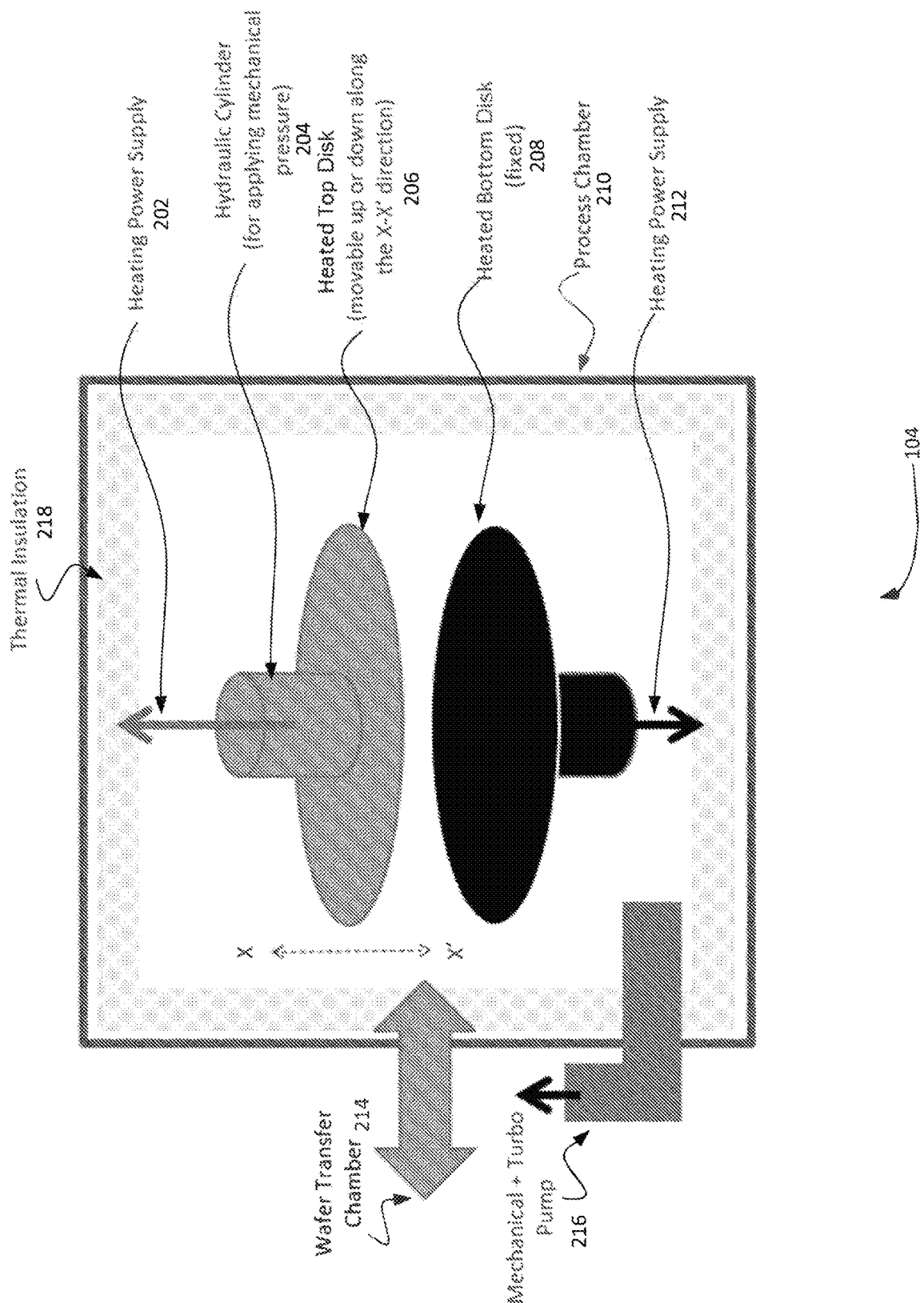
FIG. 2 illustrates an example schematic view of the internal elements of a process chamber, according to some embodiments.

FIG. 2 illustrates an example schematic view of the internal elements of process chamber 104, according to some embodiments. Wafer transfer chamber 214 provided shows transfer of the wafer back and forth to transfer chamber 102 from process chamber 104. Heated bottom disk 208 can be fixed in position and can be heated to a specified temperature (e.g. 500° C., etc.). Heat power supply 220 can maintain heat on the heated bottom disk 208. This can be done with a ±3° C. uniformity (and/or near-zero non-uniformity) across the heat bottom disk 208. Heated top disk 206 can move up and down along an x and x prime axis. Heated top disk 206 has an independent heating supply (e.g. heat power supply 202). Heated top disk 206 can be operated with hydraulic cylinder 204, a motor, and the like. Heated top disk 206 can be moved to provide mechanical pressure. By way of example, this pressure can be 50 to 125 psi, or more. The wafer is inserted on top of heated bottom disk 208. While the heated top disk 206 applies mechanical pressure to the diffusion-couple while the chamber pressure is maintained at a low value. This pressure can be for example, $10^{-6}$ to $10^{-7}$ torr to prevent contamination of the growth process. Chamber pressure can be regulated by mechanical/turbo pump 216 and associated equipment, sensors, and software.

An example operation of process chamber 104 is now discussed. Process chamber 104 can be used to deposit/grow a number of layers (e.g. monolayer or few-layer graphene (FLG) structures, or multi-layer graphene (MLG) structures). To grow graphene, a carbon/graphene source is deposited on a thin film of nickel (e.g., 100 nm in thickness). The graphene source (and/or other carbon-source) can be, inter alia: a graphite powder, a liquid/slurry form as a solvent with graphite, a layer of amorphous carbon deposited on nickel. Different deposition methods and tools can be utilized to deposit the thin film of nickel followed by the carbon source deposition on top of the nickel. The nickel, or other diffusion layer, may include thicknesses for example, such as, about 50 nm, about 75 nm, about 100 nm, about 150 nm, about 200 nm, about 250 nm, about 300 nm, and the like. The applied mechanical pressure breaks up the carbon/graphene source into carbon atoms, which then diffuse through the nickel and then recombine on the other side of the nickel film on top of the target substrate (for example, such as, a dielectric layer on a Si wafer). Once the formation of the desired number of graphene layers is completed, the nickel film and the remains of the carbon source are then removed.

Figure 3:
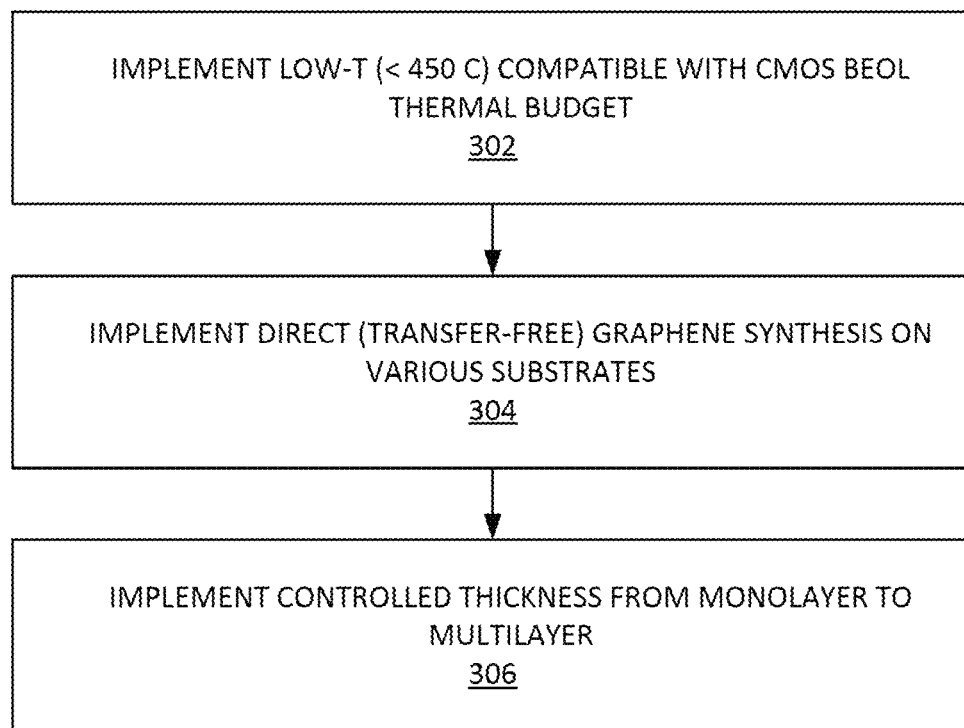
FIG. 3 illustrates an example graphene synthesis tool process, according to some embodiments.

FIG. 3 illustrates an example graphene synthesis tool process 300, according to some embodiments. Graphene synthesis tool process 300 can be used to operate carbon-source synthesis tool 100 or any of the other equipment/apparatus disclosed or suggested herein. Graphene synthesis tool process 300 can grow graphene at relatively low temperatures (e.g. 300-450° C., etc.). It is noted that when process chamber 104 is below ~450° C. then it can be compatible with a CMOS/BEOL thermal budget. BEOL are process steps that take place after front-end-of-line transistors are fabricated. Once a fabrication process has built the transistors on the wafer, the subsequent processing steps should be within the ~450° C. thermal budget to avoid damage to the transistors and various junctions that may lead to shorts and reliability issues.

Graphene synthesis tool process 300 may synthesize graphene while the number of graphene layers can be controlled by adjusting process parameters. Graphene synthesis tool process 300 can directly grow on top of any substrate (e.g. dielectric/Si substrate, metallic substrate, etc.). Graphene synthesis tool process 300 can synthesize graphene to thin/few layer coating of a metallic substrate as well.

More specifically, in step 302, graphene synthesis tool process 300 can implement low-temperature (e.g. <450° C.) graphene films compatible with a CMOS/BEOL thermal budget. In step 304, graphene synthesis tool process 300 can implement a direct (e.g. transfer-free) graphene synthesis on various substrates. In step 306, graphene synthesis tool process 300 can implement controlled thickness from monolayer to multilayer.

Figure 7:
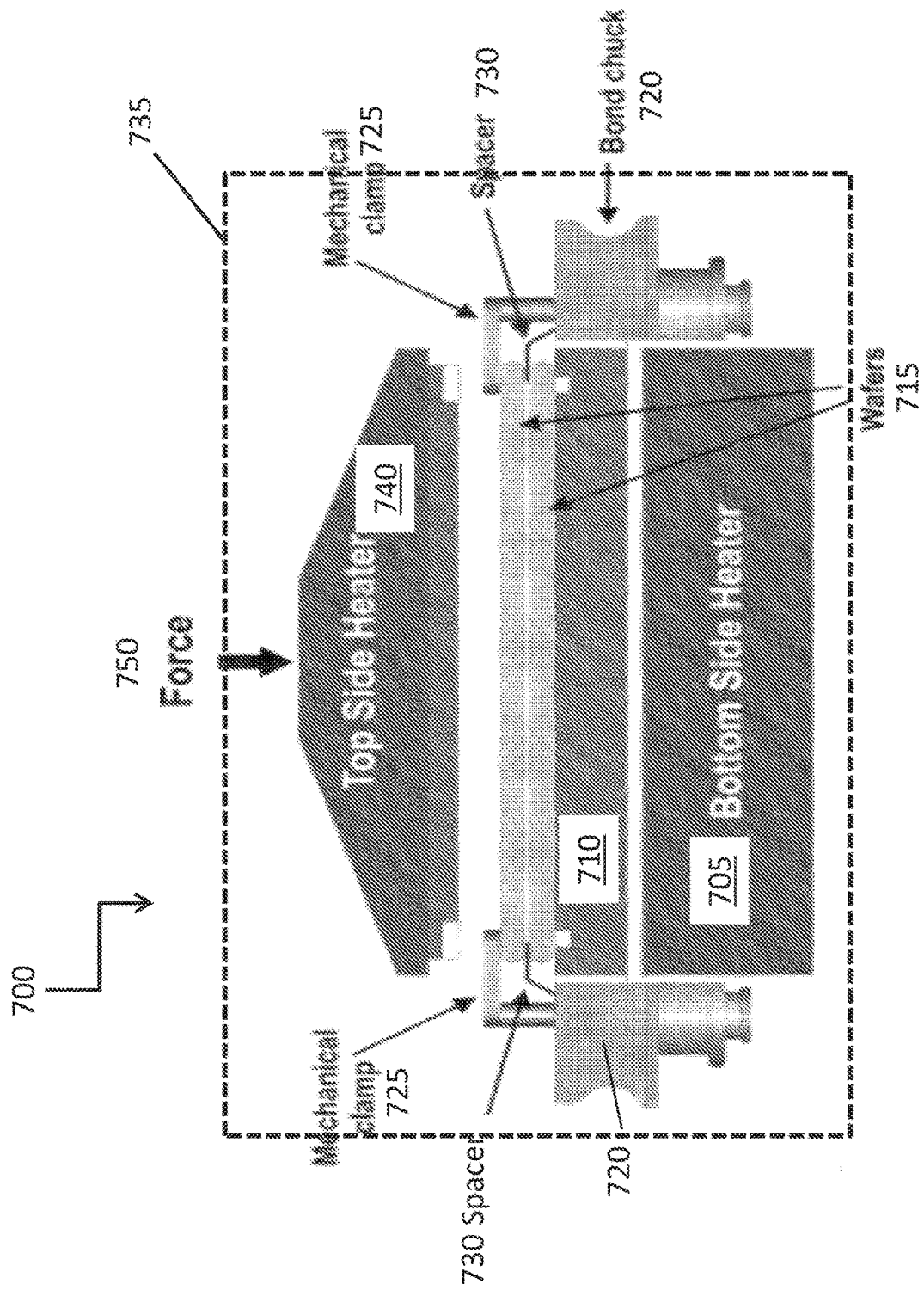
FIG. 7 illustrates an example side-view illustration of a commercial bonding tool, which may be utilized as a graphene process chamber(s), or more, of a carbon-source synthesis tool, according to some embodiments.

Example Retasked Tools for Low-Temperature/BEOL-Compatible Highly Scalable Graphene Synthesis FIG. 7 illustrates an example side-view of a commercial bonding tool 700, which may be utilized as a graphene process chamber(s), or more, of a carbon-source synthesis tool, according to some embodiments. Commercial bonding tool 700 may include Bottom Side Heater 705, Bottom Side Bonding Platen 710, or a heatable chamber, wafers to be bonded 715 (which may now be replaced with synthesis substrates as utilized herein and incorporated references), Bond Chuck(s) 720, Mechanical Clamp(s) 725, Spacer(s) 730, Top-Side Heater 740, and Bonding Force 750 (which may now be a synthesis accelerating force).

Bottom Side Heater 705 and Top-Side Heater 740 may be controlled separately, or the entire chamber can be heated, typically up to 500° C., or in tandem depending on engineering, design, and logistical considerations. Radial temperature control may also be outfitted to facilitate a more uniform final bonding or synthesis result. Bonding pressure, via at least Bonding Force 750, can typically achieve up to 200 kN, and radial pressure adjustment may be designed into the surfaces and forces applied. This force adjustment capability can be used to advantage for controlling synthesis acceleration and the uniformity of that synthesis acceleration.

An example a bonding method may include: Loading wafers/substrates 715 to be bonded into commercial bonding tool 700, providing for temperature equilibration to a desired profile, aligning one wafer to the other (depending on the type of processing desired; for example, to mm level, sometimes to nanometer level), perhaps repeating the align/equilibrate steps, soft bonding by applying a small Bonding Force 750, checking alignment, then applying the full desired Bonding Force 750 at the desired temperature and for the desired time, cooling the processed synthesis wafer/substrate in the desired profile, which affects the resultant wafer-to-wafer stack stress and across the wafer/substrate 715 uniformity of alignment (alignment of wafer to wafer in bonding situations).

An example carbon-source synthesis process (a single wafer process is described) may include: Preparing the wafer/substrate 715 (generally singular in this case, depending on engineering and machine design and other considerations) by depositing the layers of material described herein and within incorporated references for facilitating a carbon-source synthesis process, loading wafer/substrate 715 into commercial bonding tool 700, providing for temperature equilibration to a desired profile, for single wafer synthesis process the alignment time-consuming sub-steps may not be necessary and thus save process time, applying the full desired synthesis Force 750 at the desired temperature and for the desired time, cooling the processed synthesis wafer/substrate 715 in the desired profile, which for synthesis is much shorter than for most bonding cases.

It is noted that some process schemes involve two or more wafers/substrates per position (i.e. one wafer/substrate on top of the other on top of another and so on, generally (but not necessarily) with the active 'top' of the wafer/substrate facing outwards, towards each platen/disk) in the apparatus, where the heat and compression acceleration can be applied to the two or more wafers/substrates simultaneously and thus synthesize the graphene on all of the wafers/substrates. This, in some ways, is similar to the bonding process scheme, where two wafers are 'stacked' and then aligned, then bonded, whilst within the bonding apparatus.

Commercial bonding tool 700 may include an apparatus and software (not shown) which facilitates alignment of the two wafers 715 (or synthesis substrates, which may be 2 or more). This may be accomplished via mechanical means or optical means, or a combination of both. This feature may be utilized, for example, to accomplish multiple wafer/substrate synthesis of the desired layer, such as FLG/MLG.

Commercial bonding tool 700 may include an apparatus and software which facilitates wafer-to-wafer, die-to-wafer, or die-to-die bonding. Carbon source synthesis, for example, of such as FLG/MLG, may also be accomplished on at least these substrates and structures.

Commercial bonding tool 700 (and other disclosed or suggested tools/apparatus/machines herein) may include modifications and use as an intercalation doping tool; the process, etc. is described in detail within at least incorporated reference U.S. patent application Ser. No. 18/527,043.

Figure 8A:
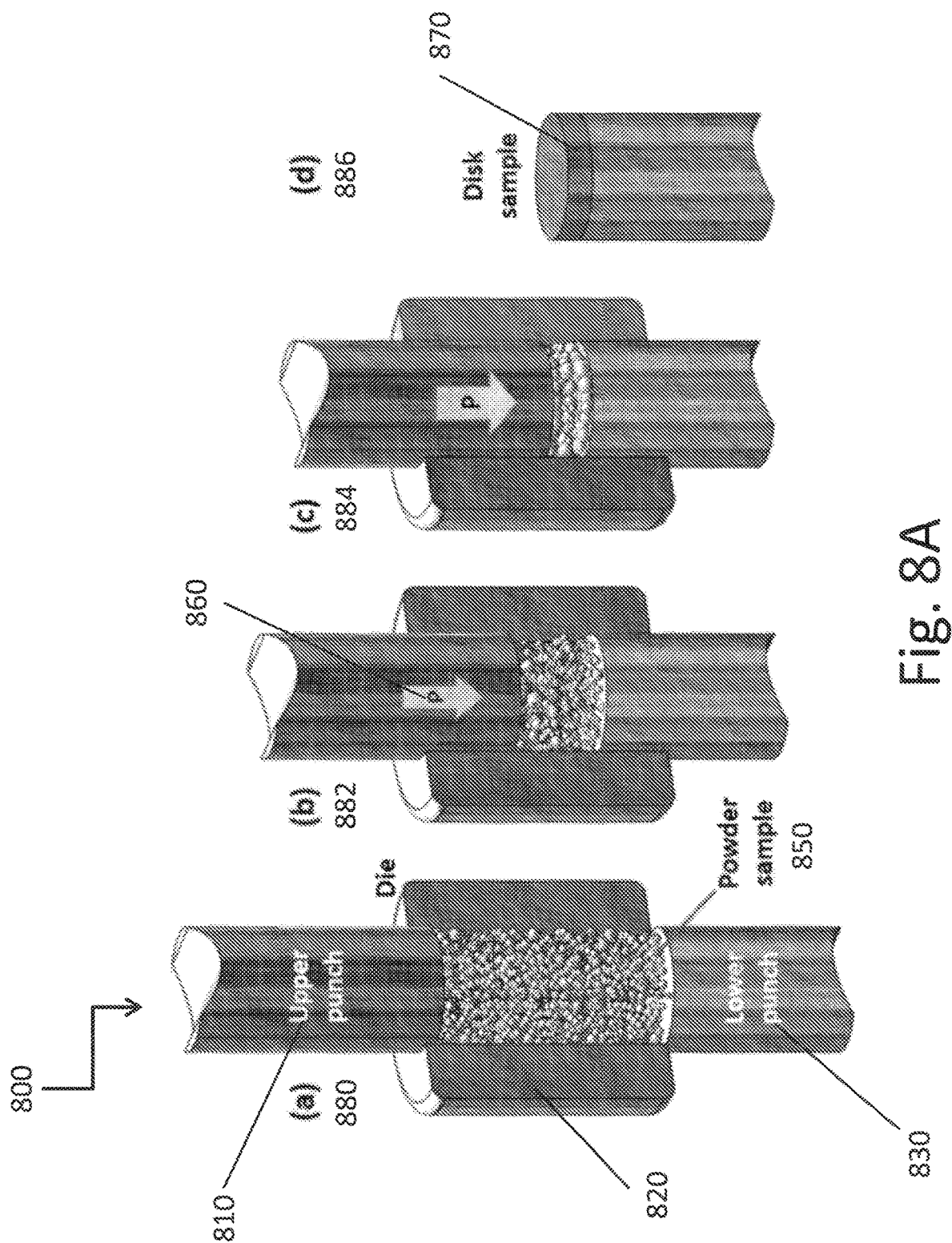
FIG. 8A illustrates an example side-view illustration of a commercial Isostatic Sintering apparatus, which may be utilized as a graphene process chamber(s), or more, of a carbon-source synthesis tool, according to some embodiments.

FIG. 8A illustrates an example side-view illustration of a commercial Isostatic Sintering apparatus 800, which may be utilized as a graphene process chamber(s), or more, of a carbon-source synthesis tool, according to some embodiments. Isostatic Sintering apparatus 800 may include Upper Punch/Press 810, Hot/Pressure Chamber Die/Shape 820, and Lower Punch/Press 830.

Upper Punch/Press 810 may include an integrated or non-integrated Upper Heater (not shown). Lower Punch/Press 830 may include an integrated or non-integrated Lower Heater (not shown). Upper and Lower heaters may be controlled separately, typically up to 500° C., or in tandem depending on engineering, design, and logistical considerations. Radial temperature control may also be outfitted to facilitate a more uniform final bonding or synthesis result. Upper Punch/Press 810 and Lower Punch/Press 830 may be actuated to provide pressure on Powder Sample 850 to form Disk Sample 870 via, for example, hydraulic means, screw leverage, and so on, depending on engineering, cost, speed and design concerns.

With appropriate modifications, wafers/substrates may be placed on the Lower Punch/Press 830 with a carbon source on the wafer/substrate already, or supplied within the chamber such as Powder Sample 850, and the graphene synthesis on the wafer/substrate may proceed as described. Radial temperature control may also be outfitted to facilitate a more uniform final sintering or synthesis result. Sintering/Synthesis Force 860 pressure, via at least Sintering/Synthesis Force 860, can typically achieve up to 1000 kN, and radial pressure adjustment may be designed into the surfaces and forces applied. This force adjustment capability can be used to advantage for controlling synthesis acceleration and the uniformity of that synthesis acceleration.

Hot/Pressure Chamber Die/Shape 820 may include a circular shape matching or slightly larger or than the Desired Substrate. The shape of Hot/Pressure Chamber Die/Shape 820 may include rectangles and so on to match the Desired Substrate shape. Volume of Hot/Pressure Chamber Die/Shape 820 may be modified due to engineering and process considerations; for example, such as use of a gaseous carbon (or doping) source.

For an exemplary isostatic sinter processing, Isostatic Sintering apparatus 800 may include an initial condition (a) 880, wherein Powder Sample 850 may be loaded into the Hot/Pressure Chamber Die/Shape 820 which may be heated for temperature acceleration, and then compressed by moving Upper Punch/Press 810 towards Lower Punch/Press 830, thus reducing the volume of the process chamber and compressing Powder Sample 850. Heat, of course, may be generated by this compression of the initial volume and may need to be removed from the apparatus chamber to maintain temperature uniformity and/or may be used to accelerate any reactions and phase changes desired. In step (b) 882, Force 860 may be applied and move Upper Punch/Press 810 towards Lower Punch/Press 830, thus making chamber volume smaller, compressing the material within. Step (c) shows the exemplary final position of Upper Punch/Press 810, the apparatus 800 which has now created disk sample 870 as shown in step (d).

For an exemplary graphene synthesis processing using a commercial or research Isostatic Sintering apparatus, for example exemplary Isostatic Sintering apparatus 800, this processing may include an initial condition (a) 880, wherein a wafer/substrate (not shown) may be loaded into the Hot/Pressure Chamber Die/Shape 820, may be placed on Lower Punch/Press 830 within the process chamber, which may be heated for temperature acceleration, and then compressed by moving Upper Punch/Press 810 towards Lower Punch/Press 830, thus reducing the volume of the process chamber and compressing Powder Sample 850. The wafer/substrate, as described previously herein and in incorporated references, may include a carbon source material/layer disposed on top of a diffusion material (such as Ni), which may be disposed above a dielectric (such as an inter-metal dielectric, silicon oxide, low-k materials, and such) which may have 2D or 3D stacks/circuitry underneath. The carbon source for the graphene synthesis may also be supplied in various forms, such as gaseous hydrocarbons, disposed in the process chamber above the wafer/substrate. Heat, of course, may be generated by this compression of the initial volume and may need to be removed from the apparatus chamber to maintain temperature uniformity and/or may be used to accelerate any reactions and phase changes desired. In step (b) 882, Force 860 may be applied and move Upper Punch/Press 810 towards Lower Punch/Press 830, thus making chamber volume smaller, compressing the carbon source material and encouraging diffusion through the diffusion layer to form graphene on the surface f the exemplary dielectric. Step (c) shows the exemplary final position of Upper Punch/Press 810, the apparatus 800 as shown in step (d) where the 'Disk Sample' 870 is the wafer/substrate with remainder carbon source disposed on top of the diffusion layer (such as Nickel) disposed on top of the newly formed MLG, which is disposed on top of the exemplary dielectric of the wafer/substrate.

Figure 8B:
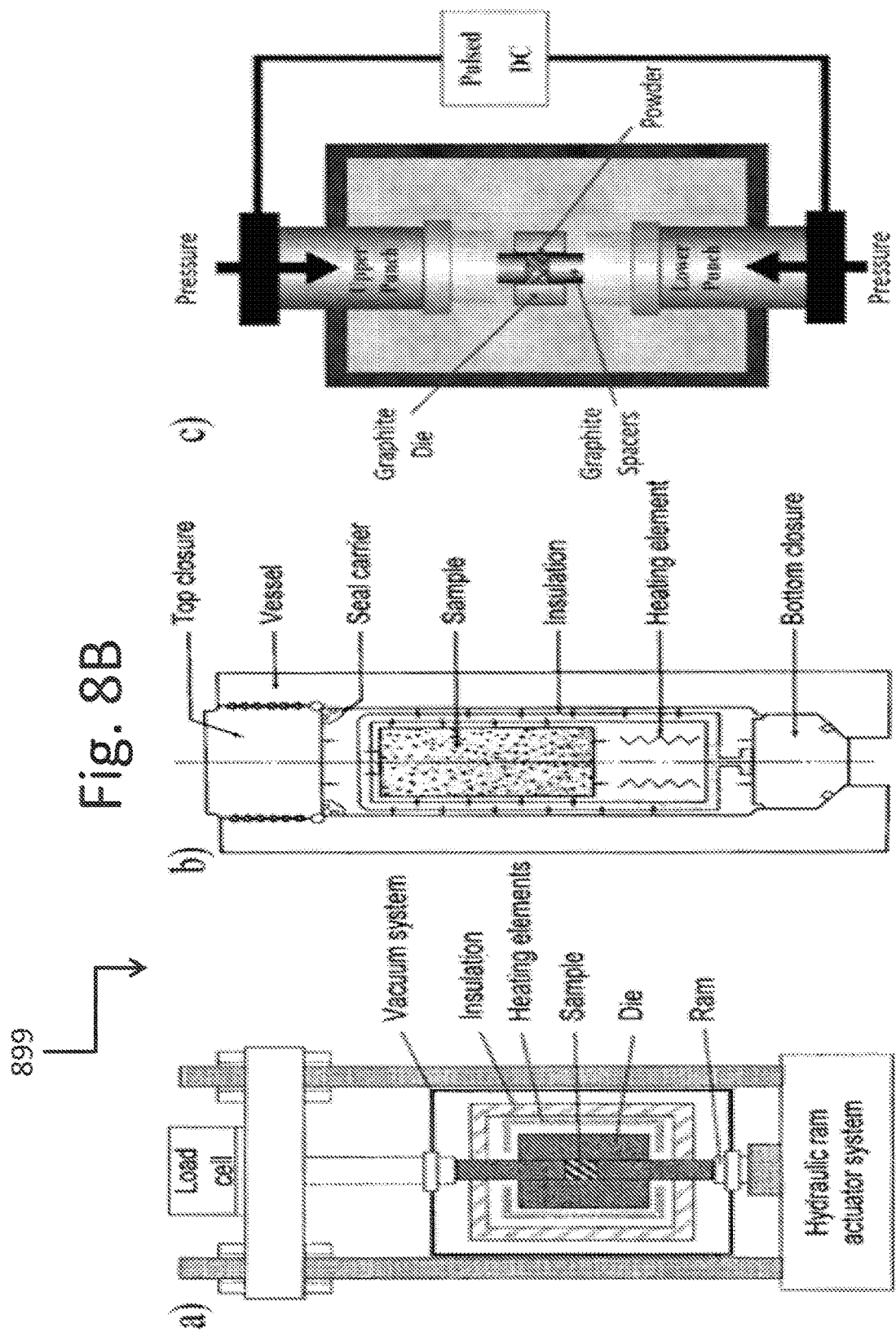
FIG. 8B illustrates an example side-view illustrations of other commercial and research Isostatic Sintering apparatus.

FIG. 8B illustrates an example side-view of other commercial and research Isostatic Sintering apparatus 899. There are many such configurations possible. The web reference is included on the figure drawing sheet. These machines can also be employed to supply the temperature and pressure acceleration for a graphene synthesis process. As well, not just wafer-to-wafer bonding, wafer graphene synthesis, and wafer intercalation doping can be realized, but also die-to-wafer and die-to-die bonding and similarly graphene synthesis, and intercalation doping can be realized.

Figure 9:
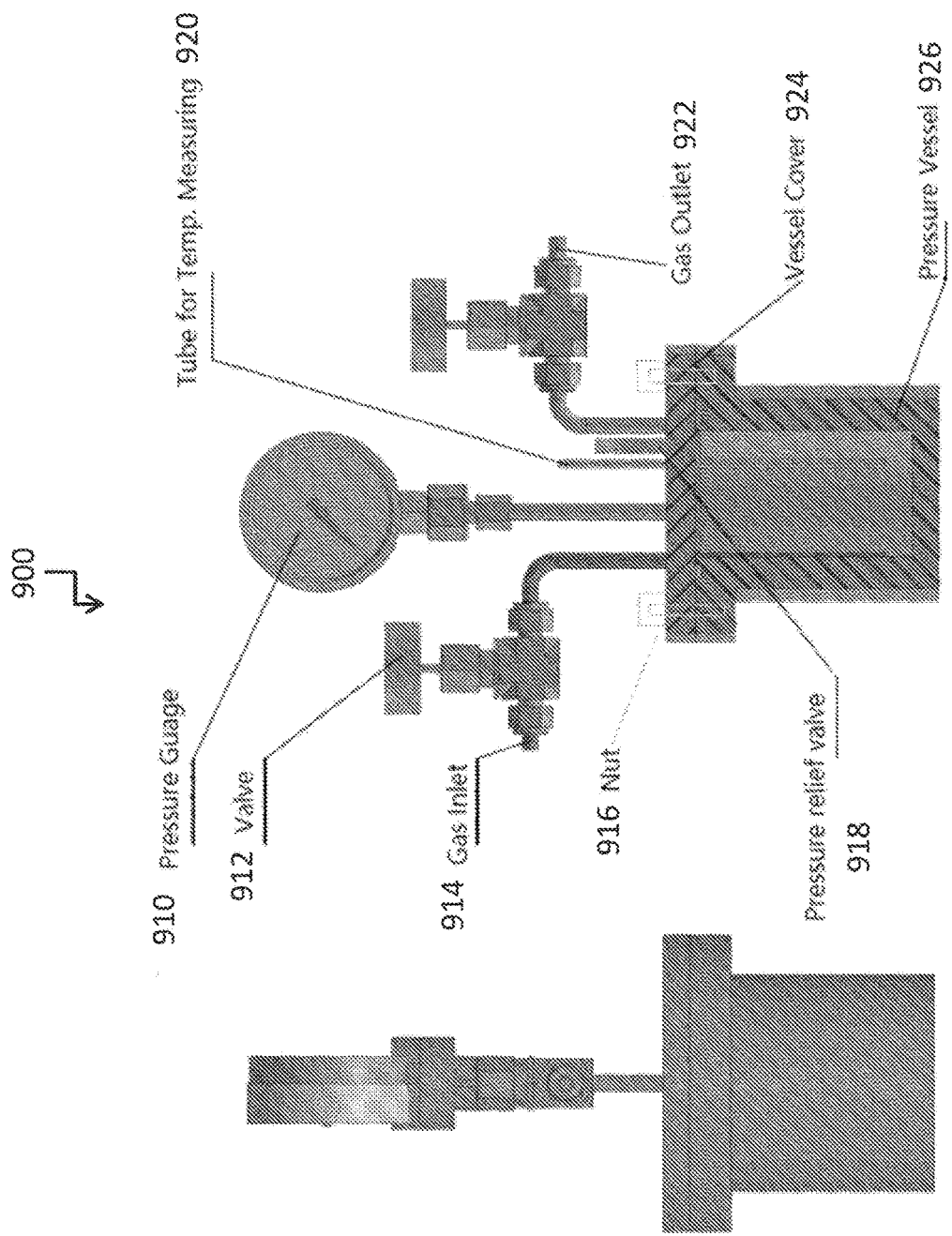
FIG. 9 illustrates an example side-view illustration of a commercial/research Hot Isostatic Press (HIP) apparatus, which may be utilized as a graphene process chamber(s), or more, of a carbon-source synthesis tool, according to some embodiments.

FIG. 9 illustrates an example side-view illustration of a commercial/research Hot Isostatic Press (HIP) apparatus 900, which may be utilized as a graphene process chamber (s), or more, of a carbon-source synthesis tool, according to some embodiments. HIP apparatus 900 may include Pressure Gauge 910, gas inlet Valve 912, Gas Inlet 914, Nut(s) 916, Pressure Relief Valve 918, Tube for Temperature Measuring 920, Gas Outlet 922, Vessel Cover 924, and Pressure Vessel 926. The HIP apparatus 900 utilizes high pressure gas to provide the compression acceleration for forming graphene, as well as temperature acceleration from heat supplied to the substrate and process chamber Pressure Vessel 926.

Process chamber Pressure Vessel 926 may include an integrated or non-integrated Heater (not shown). Vessel Cover 924 may include an integrated or non-integrated Lower Heater (not shown). Pressure Vessel 926 and Vessel Cover 924 heaters may be controlled separately, typically up to 500° C., or in tandem depending on engineering, design, and logistical considerations. Radial (with respect to the wafer/substrate) temperature control may also be outfitted to facilitate a more uniform final synthesis result. Gas inlet Valve 912 may be actuated to provide gaseous pressure through Gas Inlet 914 to process chamber Pressure Vessel 926, thus encouraging and accelerating graphene synthesis, or other synthesis processes.

With appropriate modifications to HIP apparatus 900, wafers/substrates may be placed within process chamber Pressure Vessel 926 with a carbon source on the wafer/substrate already, or supplied within the chamber such as at least a portion of the pressurization gas including a carbon containing component, and the graphene synthesis on the wafer/substrate may proceed as described herein and in incorporated references. Radial temperature control may also be outfitted to facilitate a more uniform final synthesis result. The gaseous pressure may constitute a force impinging on the wafer/substrate, can typically achieve up to 10,000 kN, and being a gaseous applied pressure, its radial pressure gradient should be close to zero, even when approaching a liquid phase. Hydraulic pressure, through liquids, may also be utilized in this type of machine, with the appropriate modifications to handle the viscous gas called liquid. This can capability can be used to advantage for controlling synthesis acceleration and the uniformity of that synthesis acceleration.

Pressure Vessel 926 may include a circular shape matching or slightly larger or than the desired substrate. The shape of Pressure Vessel 926 may include rectangles and so on to match the desired substrate shape, but may not necessarily so. As well, gaseous application of the pressure for this system may allow a simpler and more practical multiple-wafers-at-a-time processing and process chambers/Pressure Vessel 926 configurations. The interior shape of process chamber/Pressure Vessel 926 and potential gaseous distribution manifolds within it may be modified due to engineering and process considerations; for example, such as use of a gaseous carbon (or doping) source.

For an exemplary graphene synthesis processing using a commercial or research HIP apparatus, for example exemplary HIP apparatus 900, this processing may include an initial condition wherein a wafer/substrate (not shown) may be loaded into the process chamber Pressure Vessel 926 which may be heated for temperature acceleration, and then compressed by opening Valve 912 and supplying the desired pressure of gas through Gas Inlet 914. The wafer/substrate, as described previously herein and in incorporated references, may include a carbon source material/layer disposed on top of a diffusion material (such as Ni), which may be disposed above a dielectric (such as an inter-metal dielectric, silicon oxide, low-k materials, and such) which may have 2D or 3D stacks/circuitry underneath. The carbon source for the graphene synthesis may also be supplied in various forms, such as gaseous hydrocarbons, disposed in the process chamber above the wafer/substrate. Heat, of course, may be generated by this compression and may need to be removed from the apparatus chamber to maintain temperature uniformity and/or may be used to accelerate any reactions desired. The gaseous pressure within process chamber Pressure Vessel 926 may include a higher than nominal atmospheric pressure, for example, such as, about 2 Bar gaseous pressure, about 5 Bar gaseous pressure, about 10 Bar gaseous pressure, about 50 Bar gaseous pressure, about 100 Bar gaseous pressure, and so on. Construction and support of process chamber Pressure Vessel 926 to provide a safe tool is well-known in the art. This gaseous pressure will compress the carbon source material and encourage diffusion through the diffusion layer (typically Nickel) to form graphene on the surface of the exemplary dielectric.

There are many such configurations possible. These machines can also be employed to supply the temperature and pressure acceleration for a graphene synthesis process. As well as for intercalation doping of 2D materials, for example, such as MLG structures.

Figure 10:
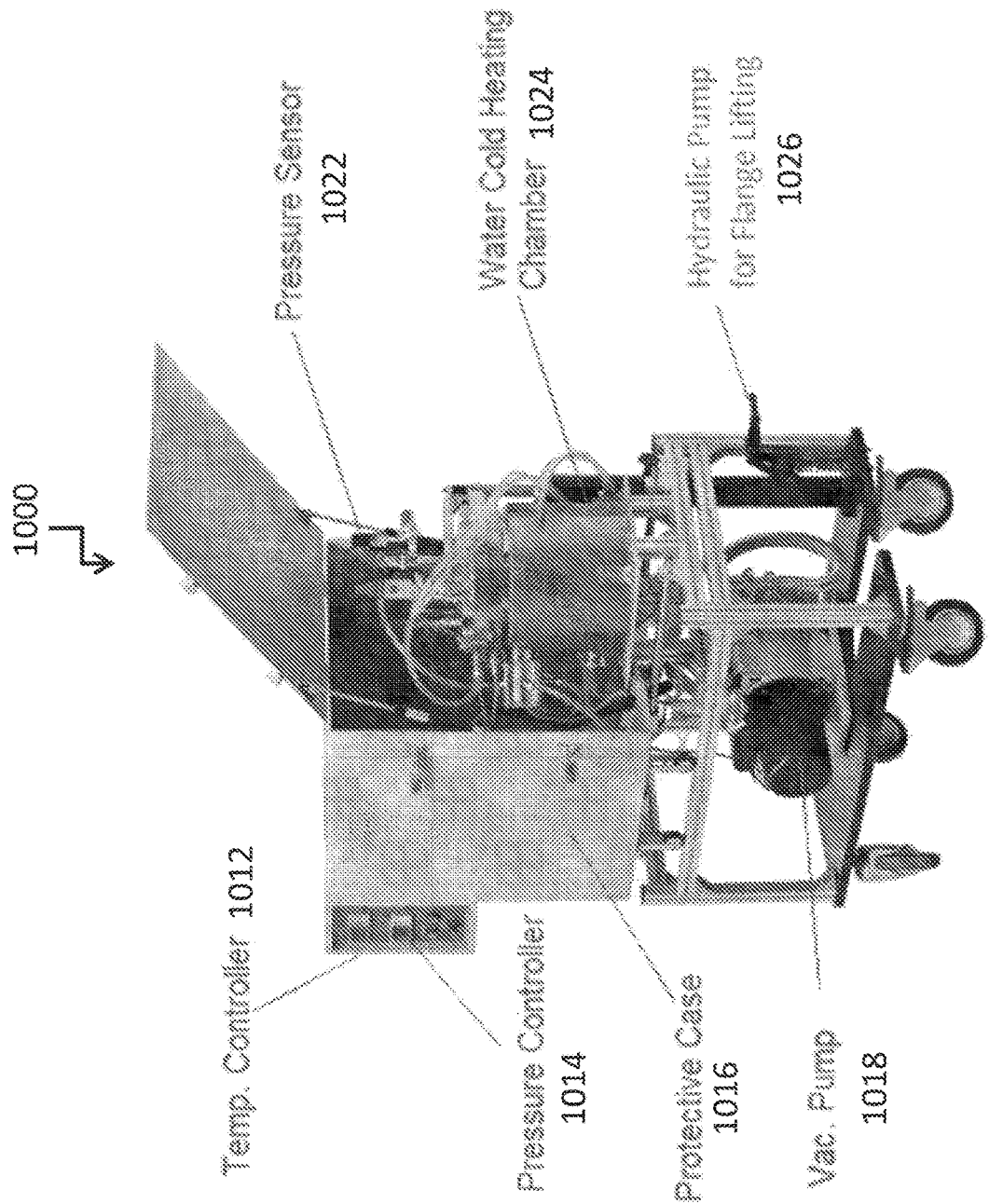
FIG. 10 illustrates an exemplary view of an alternative commercial and research Hot Pressure Vessel (HPV) apparatus design, which may be utilized as a graphene process chamber(s), or more, of a carbon-source synthesis tool, according to some embodiments.

FIG. 10 illustrates an exemplary view of an alternative commercial and research Hot Pressure Vessel (HPV) apparatus 1000 design, which may be utilized as a graphene process chamber(s), or more, of a carbon-source synthesis tool, according to some embodiments. HPV apparatus 1000 may include Temperature Controller 1012, Pressure Controller 1014, Protective Case 1016, Vacuum Pump 1018, Pressure Sensor 1022, Water Cold/Heating Chamber 1024, and Hydraulic Pump for Flange Lifting 1026. The HPV apparatus 1000 utilizes high pressure gas to provide the compression acceleration for forming graphene, as well as temperature acceleration from heat supplied to the substrate and process chamber Water Cold/Heating Chamber 1024.

There are many such configurations possible. These machines can also be employed (with or without any modifications) to supply the temperature and pressure acceleration for a graphene synthesis process. As well as for intercalation doping of 2D materials, for example, such as MLG structures.

Example Embodiments

An example embodiment can start with a wafer (e.g. Si/SiO$_2$), then deposit a thin film of a catalyst metal thin-film such as nickel. The morphology of the catalyst film can be tuned during the deposition or after deposition (e.g., via annealing etc.) to meet specific application needs. Then deposit a uniform distribution of carbon-source on top of Ni. A pressure of 65 to 85 psi is applied on the carbon-source. A disc with a diameter slightly larger than the 300 mm wafer can be used. The substrate (wafer) can be heated to 300° C. to 450° C. Once the pressure is applied, a portion of the carbon items diffuse through the Ni film. The carbon-source/Ni/SiO$_2$/Si can act as a diffusion-couple. The carbon atoms can recombine on the other side of the Ni (e.g., facing the SiO$_2$) to form a monolayer, few-layer, or multilayer graphene.

Various processing steps can then be implemented (e.g., removing remaining graphite, removing metal catalyst (Ni) layer, etc.).

Instead of an SiO$_2$, the substrate can be copper or another metal (such as cobalt, ruthenium, molybdenum, tungsten, or an alloy metal, etc.), or a low dielectric constant (low-k) material such as porous silicon-dioxide or hydrogen silsesquioxane (HSQ), or black diamond, etc., or even any patterned substrate formed with metals and dielectrics, etc. In this embodiment, the modification can include a sacrificial layer of amorphous carbon between the Ni and the Cu. In this way, the Ni and the Cu can be prevented from forming an alloy. In other examples, other metals can include, inter alia: Co, Ni, Ru (as both a substrate and/or a catalyst), molybdenum, etc., or a metal compound.

The thicknesses of the substrates and catalysts can be set (e.g. 100 nm, etc.). The number of layer(s) of graphene (i.e., its thickness) required can be a function of thickness of Ni along with other process parameters including time, temperature, pressure, and grain-size of the catalyst film.

The substrate wafer can be 300 mm or 200 mm or smaller/larger (450 mm). A temperature controller can be used to maintain the temperature anywhere from room temperature (~25° C.) to 500° C., or higher as long as process compatibility is met. The graphite powder can be spread in a uniform or pre-patterned manner. A chuck (disk) can be used to press down on the uniformly distributed graphite. Other carbon-containing compounds can also be used as a substitute.

Pressure on the substrate forming the diffusion-couple can be applied by means of mechanical force for instance by employing an instrument such as a chuck, or via any non-contact means such as increasing the substrate environment pressure by, for instance, using a gas pressure (1 bar to several 1000's of bars). A single substrate or multiple substrates as batches can be processed at once. In addition, the gas can be normal air or a specific gas such as Ar, N2 or a mixture of many such gases etc. As taught and suggested herein, there are many commercial and research machines/apparatus which may successfully run the graphene synthesis process disclosed; for example, such as commercial bonding tool 700, Isostatic Sintering apparatus 800, Hot Isostatic Press (HIP) apparatus 900, and Hot Pressure Vessel (HPV) apparatus 1000.

Application of heat can be from any source capable of generating a temperature on the substrate. In some embodiments, both the top disk and/or the bottom disk can be heatable. In some embodiments, the top substrate disk and/or the bottom substrate disk may not be heatable, and there can be another heat source such as, for example, the pressure chamber walls, etc.

Example Systems and Methods for Migration of a Deposition Material Across a Diffusion Couple Deposited on a Substrate to a Substrate Surface Example systems and methods can provide for the migration of a deposition material across a diffusion couple deposited on a substrate to the substrate surface. This approach provides many advantages for the deposition of the material.

Figure 4:
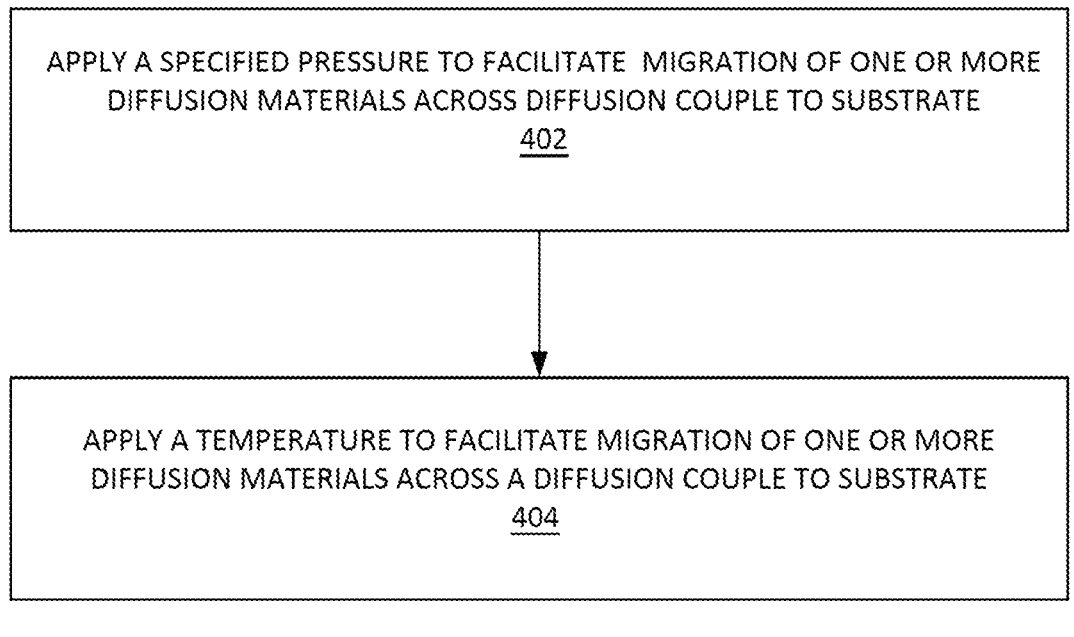
FIG. 4 illustrates an example high-level flowchart of a process for migration (e.g., diffusion) of a deposition material across a diffusion couple metal deposited on a substrate (e.g., Si wafer) forming a diffusion-couple, to the substrate surface, according to some embodiments.

FIG. 4 illustrates an example process 400 for migration of a deposition material across a diffusion couple deposited on a substrate to a substrate surface, according to some embodiments. Process 400 can use a reactor system to facilitate the migration of one or more diffusion materials across a diffusion couple to a substrate by implementing the following steps. In step 402, process 400 can apply a specified pressure to facilitate the migration of the one or more diffusion materials across the diffusion couple to the substrate. In step 404, process 400 can apply a temperature to facilitate the migration of the one or more diffusion materials across a diffusion couple to the substrate.

Figure 5:
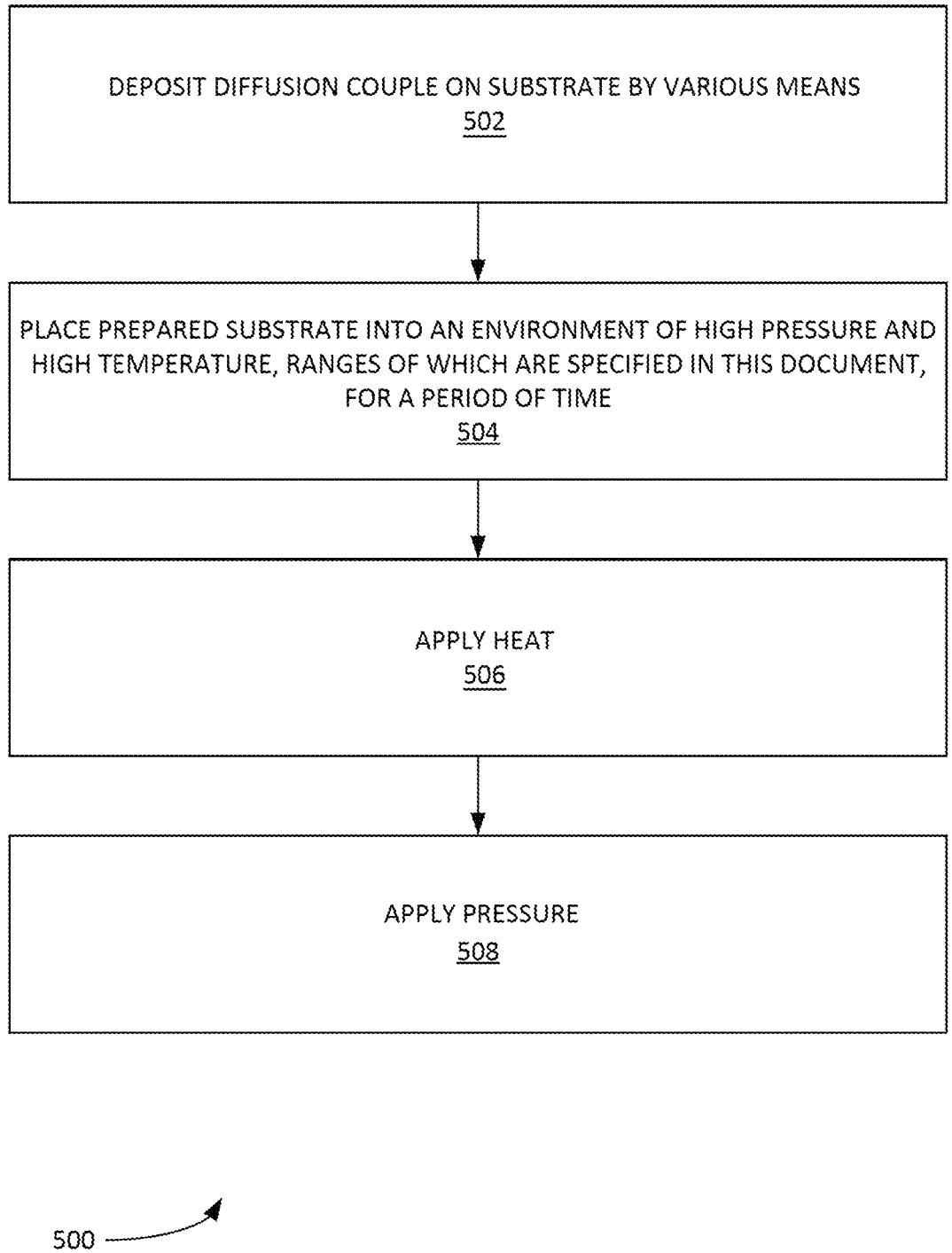
FIG. 5 illustrates another example high-level flowchart of a process for the migration of a deposition material across a diffusion couple metal deposited on a substrate to the substrate surface, according to some embodiments.

FIG. 5 illustrates another example process 500 for or migration of a deposition material across a diffusion couple deposited on a substrate to a substrate surface, according to some embodiments. Process 500 provides the ability to deposit a material that it may not be possible to deposit directly using conventional methods. For example graphene is not known to be directly synthesized on silicon. Process 500 permits this to be realized. It is noted that the grain and other material structures of the deposited material may be tailored by appropriately varying the structure of the diffusion couple and/or process conditions.

In step 502, process 500 deposits the diffusion couple on the substrate by various means, including the most commonly used ones and then depositing some form of the material to be deposited on the substrate on top of the diffusion couple. This may herein be referred to as the prepared substrate or the layer substrate.

In step 504, process 500 places the prepared substrate into an environment of high pressure and high temperature, ranges of which are specified in this document and incorporated by reference citations, for a period of time.

In step 506, process 500 can perform the application of heat is accomplished through, inter alia: resistive heating, radiative heating, gas heating and the like.

In step 508, process 500 can apply pressure as well. This can be implemented through, inter alia: mechanical means, through gas pressure, through flexible membranes, through liquid pressure, and the like.

Figure 6:
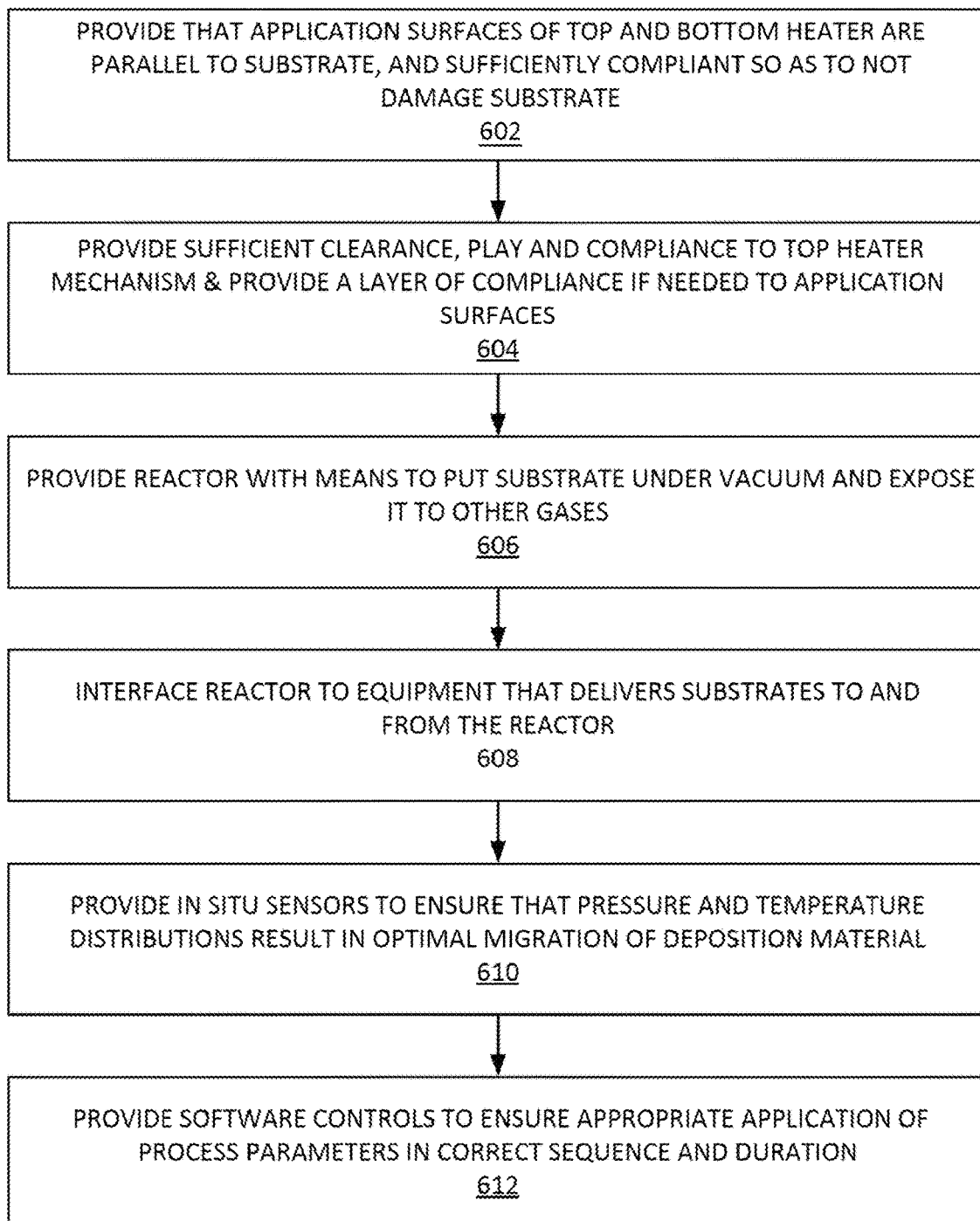
FIG. 6 illustrates an example high-level flowchart of a process that uses top and bottom heaters to compress and heat a substrate with uniform pressure and temperature, according to some embodiments.

Example Use Case: Reactor with Mechanical Application of Pressure and Direct Heating FIG. 6 illustrates an example process 600 that uses top and bottom heaters to compress a substrate with uniform pressure and temperature, according to some embodiments. Carbon-source synthesis tool 100 can be modified and/or otherwise used to implement the present example embodiment. The substrate is placed on a pedestal (e.g. disk) through means of a handler typical to the equipment industry. The pedestal has the ability to heat the substrate through direct contact. Note that the contact materials may be varied through use of appropriate liner materials. A top moving heater (embedded in a disk) then moves down and puts the substrate under pressure while at the same time heating it. When the process is completed, the substrate is returned out from the reactor (e.g. the process chamber of FIG. 2 supra, etc.).

In step 602, the application surfaces of the top and bottom heater are parallel to the substrate, and sufficiently compliant so as to not damage the substrate. This is accomplished by providing sufficient clearance and play and compliance to the top heater mechanism, as well as by providing a layer of compliance if needed to the application surfaces in step 604.

In step 606, the reactor may also be provided with the means to put the substrate under vacuum and expose it to other gases such as, inter alia, N2, Ar, He, and the like to optimize the process. Hence the reactor may be equipped with vacuum pumps as well as gas lines and a gas panel to ensure ability to put the substrate under various environments.

In step 608, the reactor may be interfaced to equipment that can deliver the substrates to and from the reactor. For example in the case of wafer processing the reactor may be attached to the facet of a transfer chamber that is equipped with a wafer handling robot that operates under high vacuum. In some examples, a slit valve can be provided to isolate the reactor from the rest of the system. A plurality of reactors may be attached to the transfer chamber to facilitate higher throughputs or production rates. There can also be reactors that deposit the diffusion couple including the source material attached to the transfer chamber, such as sputtering and CVD chambers, thereby permitting the creation of the layers on the substrate as well as the deposition of the final material on the same system.

In step 610, process 600 provides in situ sensors (e.g., in the reactor, etc.) to ensure that the pressure and temperature distributions in turn result in optimal migration of the deposition material across the diffusion couple. For example the pressure can be calibrated and monitored through the use of a pressure sensor on the step of the pedestal, through monitoring of the current drawn by the motor applying the pressure between the surfaces, through use of flexures configured as strain gauges embedded in the liner material and the like. Likewise the temperature can be monitored using thermocouples and RTDs mounted in the pedestals, use of IR sensors, phosphorus-based sensors, and the like.

In step 612, process 600 provides software controls to ensure appropriate application of the process parameters in the right sequence and duration.

Other configurations of the reactor that apply other forms of heat and pressure on the substrate are now discussed. It is noted that the aforementioned configuration is just one of many. Alternate configurations could include, inter alia:

Heated membraned subject to high pressure (either pneumatic or hydraulic for example);
Clamshell configurations with high temperature and high pressure heated N2, Ar, other such gases;
Large batch reactors with the same characteristics as discussed supra;
Clamshell in which combinations of the previously detailed approaches to heating and applying pressure to the substrates may be used. For example, high temperature and pressure gas could be fed in; high pressure could be fed in with the bottom heater being used to heat the substrate, bottom heater heats high temperature gas to accomplish the pressure function and maintain temperature, and so on;
Quartz body with substrate placed on a susceptor and inductively heated and pressure loading accomplished using high pressure gas; and
May also include an array of lamps in a quartz body for final temp control.

By way of example, the reactors outlined above facilitate the deposition of materials through diffusion couples, as in the use of deposition of graphene onto a silicon wafer across a nickel layer. The deposition method using diffusion couples can be applied to a wider range of deposition materials and diffusion materials.

The following sections provide certain ranges of operation for the system, as well as parameter ranges for desired material structures, composition, and the like for optimal process results.

As noted earlier the use of this method to permit migration of one material across a diffusion couple permits deposition of a material on substrate where it may previously not have been possible through other traditional deposition methods (e.g., graphene is difficult to grow directly on Si or SiO2). The systems described here facilitate the growth of graphene on Si/SiO2 by application of pressure and temperature on the carbon source deposited on a Ni layer that is in turn deposited on the Si wafer, etc.).

It is noted that the reactor can be implemented as a batch reactor and/or single substrate (wafer) reactor. It is noted that in single substrate configurations finer substrate to substrate process control than with a batch reactor can be accomplished. A method of creating a batch process with a single wafer architecture can also be realized by employing a stack of wafers between the two heaters.

Examples of Throughput Improvements for Dedicated and Retasked Tools for Processs Such as Graphene Synthesis Via Application of Pressure and Temperature In this section the disclosure and teaching will describe novel and non-obvious methods and apparatuses to increase the throughput of the machines which could be used to create graphene layers and levels for at least semiconductor devices, solar cells, optoelectronic devices, antennas, and more. These techniques and devices may be utilized in at least those machines and tools disclosed herein, sometimes modified and sometimes not, as the demands of engineering, manufacturing, financial, and other analyses take place. Processes other than graphene synthesis may also utilize these productivity/throughput improvements, especially when pressure and temperature acceleration is involved in the process efficiency. This disclosure is only to be limited by the claims presented in each application.

For at least FIGS. 11, 12A, 12B, 13A, 13B, 14A, and 14B herein, the top pressure/heat mechanism XX01 and XX05 (where XX is the Figure number), and the bottom pressure/heat mechanism XX02 and XX07 (where XX is the Figure number), are representative of the pressure and heat application of at least all the of the machines described herein, modified or unmodified. For example, 1305 and 1301 of FIG. 13B could be the Top-Side Heater 740 and Bonding/Synthesis Force 750 of the wafer bonder machine illustrated in at least FIG. 7 herein respectively. As well, 1302 and 1307 of FIG. 13B could be the Bottom Side Heater 705 and Bottom Side Bonding Platen 710 of the wafer bonder machine illustrated in at least FIG. 7 herein. Note, many times the engineering choice is to have the bottom side fixed and the force applied thru the topside of the machine, but not necessarily so. Also, for example, 1305 and 1301 of FIG. 13B could be the Heated top disk 206 and Hydraulic Cylinder 204 of the wafer synthesis machine illustrated in at least FIG. 2 herein respectively. As well, 1307 and 1302 of FIG. 13B could be the fixed Heated Bottom Disk 208 of the wafer synthesis machine illustrated in at least FIG. 2 herein. Also please note, the force does not necessarily have to be mechanical in nature. For example, for the case of the isostatic sintering machines 800/899 of FIGS. 8A and 8B and high-pressure machines of FIGS. 9 and 10 herein, the force may be applied by hydraulic and/or gaseous means, providing a 'no touch of the frontside' of the wafer/substrate. For at least FIGS. 11, 12A, 12B, 13A, 13B, 14A, and 14B herein, Arrows of Force Indicators XX60 (where XX is the Figure number) indicate the direction(s) the force(s) applied to the prepared substrates may take.

Figure 11:
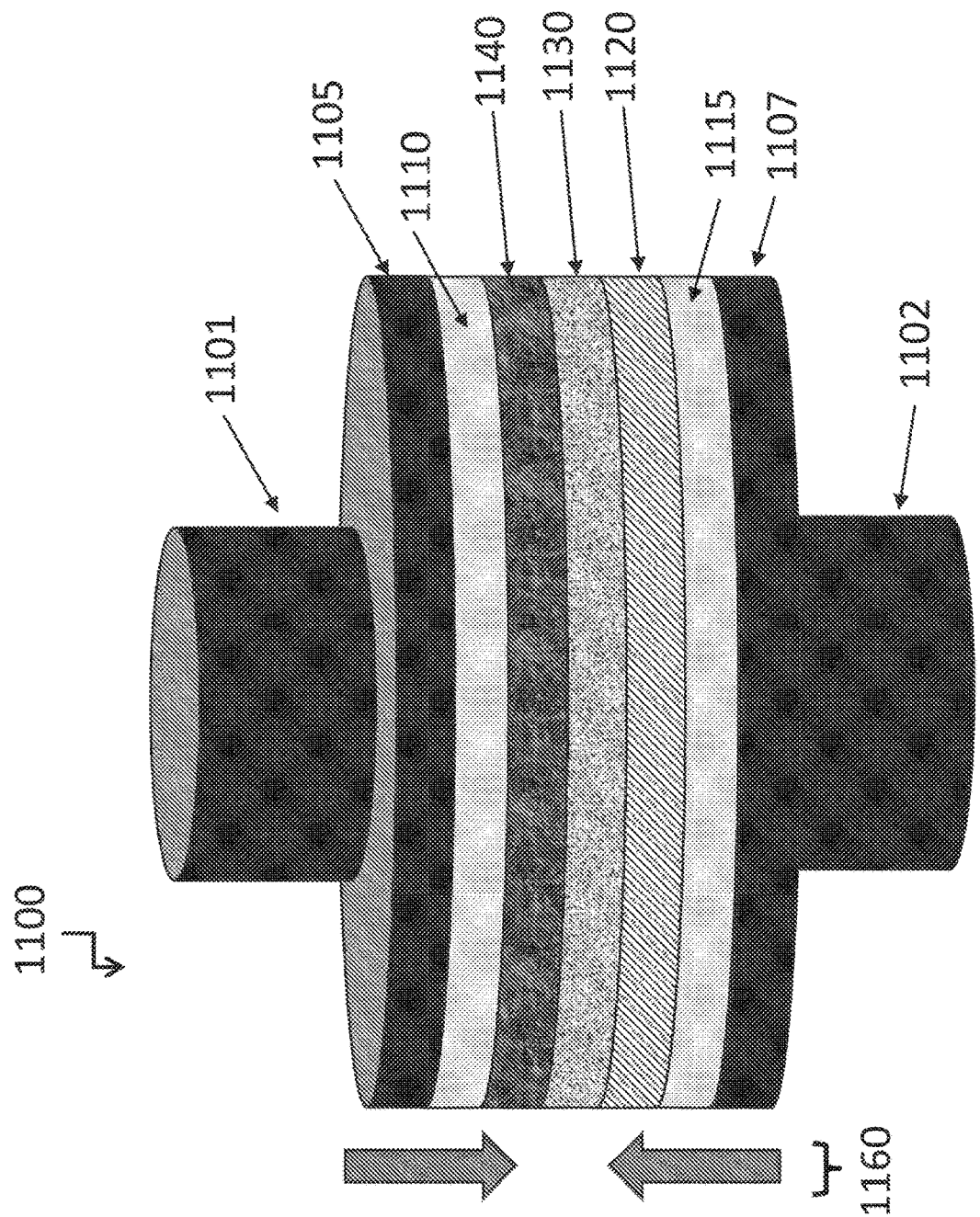
FIG. 11 illustrates an exemplary view of a nominal synthesis chamber and substrate load, according to some embodiments.

As illustrated in FIG. 11, a nominal synthesis chamber and substrate load 1100 may include at least Top Bonding/Synthesis Force/Hydraulic Cylinder 1101, Top-Side Heater/Platen 1105, Top-side Transition Plate 1110, Carbon Source 1140, Sacrificial Diffusion Layer 1130, Substrate/Wafer 1120, Bottom-side Transition Plate 1115, Bottom Side Heater/Platen 1107, and Bottom Bonding/Synthesis Force/Hydraulic Cylinder 1102, with Force Indicators 1160. The substrate load for each process in the one chamber may include Top-side Transition Plate 1110, Carbon Source 1140, Sacrificial Diffusion Layer 1130, Substrate/Wafer 1120, and Bottom-side Transition Plate 1115, thus processing one substrate/wafer for synthesis, such as graphene, in one shot, or processing step, where temperature and pressure may be applied to effect the synthesis, or other desired processing. A prepared substrate may include at least Carbon Source 1140, Sacrificial Diffusion Layer 1130, and Substrate/Wafer 1120.

Top-side Transition Plate 1110 and Bottom-side Transition Plate 1115 may include quartz, generally ultra-pure in quality, parallel faces within fractions of a degree ('wedge'), and at least one face, that touching Carbon Source 1140 and/or Substrate/Wafer 1120, may be flat/smooth and bump/defect free to a high degree. Top-side Transition Plate 1110 and Bottom-side Transition Plate 1115 may rather include various types of high temperature plastics/organic material, which may provide a defect free and force evening spread transition from Top-Side Heater/Platen 1105 to Top-side Transition Plate 1110 and/or Bottom Side Heater/Platen 1107 to Bottom-side Transition Plate 1115.

Transition plates have many uses in the processing described herein. An important application could be to stop/prevent any unwanted reactions from taking place between stacked prepared substrates, so that decoupling the stacked prepared substrates within the stack can easily take place. Theses transition plates could be engineered to be smooth, slick, and unreactive to the compounds and elements which may be touching/contacting the transition plate's surface(s). The transition plates could also include mechanical artifacts to assist the coupling and decoupling process in making or breaking up the stacks of prepared wafers/substrates. For example, such as, small notches on the outside edge of the transition plate so that a mechanism can effectively and reliably grab the transition plate to assist in coupling and decoupling. Other uses of transition plates may be the evening out of the applied forces across the wafers/substrates.

The components within the substrate load for each process in the nominal synthesis chamber and substrate load 1100 may include many types of materials and substrates for various processes which may require temperature and pressure to complete. For this example and others herein, graphene synthesis will be utilized as the exemplary substrate load or loads for processing with temperature and pressure.

Accordingly, Carbon Source 1140 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

Sacrificial Diffusion Layer 1130 may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. Substrate/Wafer 1120 may be coated with a thin layer (50-100 nm) of Sacrificial Diffusion Layer 1130 and the thickness (volume) of Carbon Source 1140 may be adjusted due to engineering considerations, especially with respect to but not exclusively due to how much carbon is required to form the desired number of layers of graphene.

Substrate/Wafer 1120 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references.

Substrate/Wafer 1120 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. Substrate/Wafer 1120 may further comprise semiconductor devices such as resistors and capacitors and inductors, one or more programmable interconnects, solar cell structures, memory structures and devices, sensors, radio frequency devices, or optical interconnect with associated transceivers. Substrate/Wafer 1120 may further include isolation layers, such as, for example, silicon and/or carbon containing oxides and/or low-k dielectrics and/or polymers, which may electrically isolate, for example, one layer from another layer. Substrate/Wafer 1120 may be a wafer, for example, a monocrystalline silicon wafer, or a substrate, for example, a glass substrate.

With reference to at least FIG. 11 herein, an example process flow utilizing exemplary nominal synthesis chamber and substrate load 1100 may be as follows. Preparation of Substrate/Wafer 1120: A silicon wafer, which may have transistors and components already processed as discussed above herein, with a silicon oxide (nominally) as a top layer may be prepared as the substrate for graphene synthesis. Coating with Sacrificial Diffusion Layer 1130: The Substrate/Wafer 1120 may be coated with a thin layer (50-100 nm or more) of transition metal such as Nickel using sputter or e-beam deposition techniques. Deposition of Carbon Source 1140: Following the deposition of the Sacrificial Diffusion Layer 1130, a 50-100 nm (or more) layer of amorphous or graphitic powder may be deposited onto the Ni coated Substrate/Wafer 1120. This carbon layer can be deposited, for example, using physical sputter, e-beam deposition, or spin-on techniques. High Pressure and Temperature Treatment: The prepared wafer, Substrate/Wafer 1120 with Sacrificial Diffusion Layer 1130 and Carbon Source 1140 onboard, may be loaded into nominal synthesis chamber 1100 sandwiched between two quartz plates, such as Top-side Transition Plate 1110 and Bottom-side Transition Plate 1115, to ensure the uniform distribution of the applied pressure. The substrate load may be placed between the Top-Side Heater/Platen 1105 and the Bottom Side Heater/

Platen 1107. The temperature of the substrate load may be allowed to stabilize and then, in this example, mechanical pressure may be applied to the substrate load via Top Bonding/Synthesis Force/Hydraulic Cylinder 1101. Generally, but not limited to, Bottom Bonding/Synthesis Force/Hydraulic Cylinder 1102 may be stationary in at least the direction towards the applied force of Top Bonding/Synthesis Force/Hydraulic Cylinder 1101. Force Indicators 1160 indicate the general average directionality of the compression forces experienced by the substrate load.

Under pressure and at elevated temperatures the formation of graphene layers accelerates. The carbon from Carbon Source 1140 diffuses through the Sacrificial Diffusion Layer 1130, accumulating on the other side of Sacrificial Diffusion Layer 1130, specifically at the nickel-silicon oxide (Ni-SiOx) interface. This accumulation results in the formation of graphene. The graphene formed can be single-layer (SLG) or multi-layer (MLG), depending on the process parameters and conditions.

The setup shown in FIG. 11, of nominal synthesis chamber and substrate load 1100, has a nominal throughput surface. We will call this a throughput of 1 (wafers/hour) for a given graphene process at whatever temperature and pressure is chosen to form the SLG or MLG desired. We will use this 'nominal' throughput of 1 to compare and quantify (rough estimates) the following improved productivity concepts and flows, shown in at least FIGS. 12, 13 and 14.

Figure 12A:
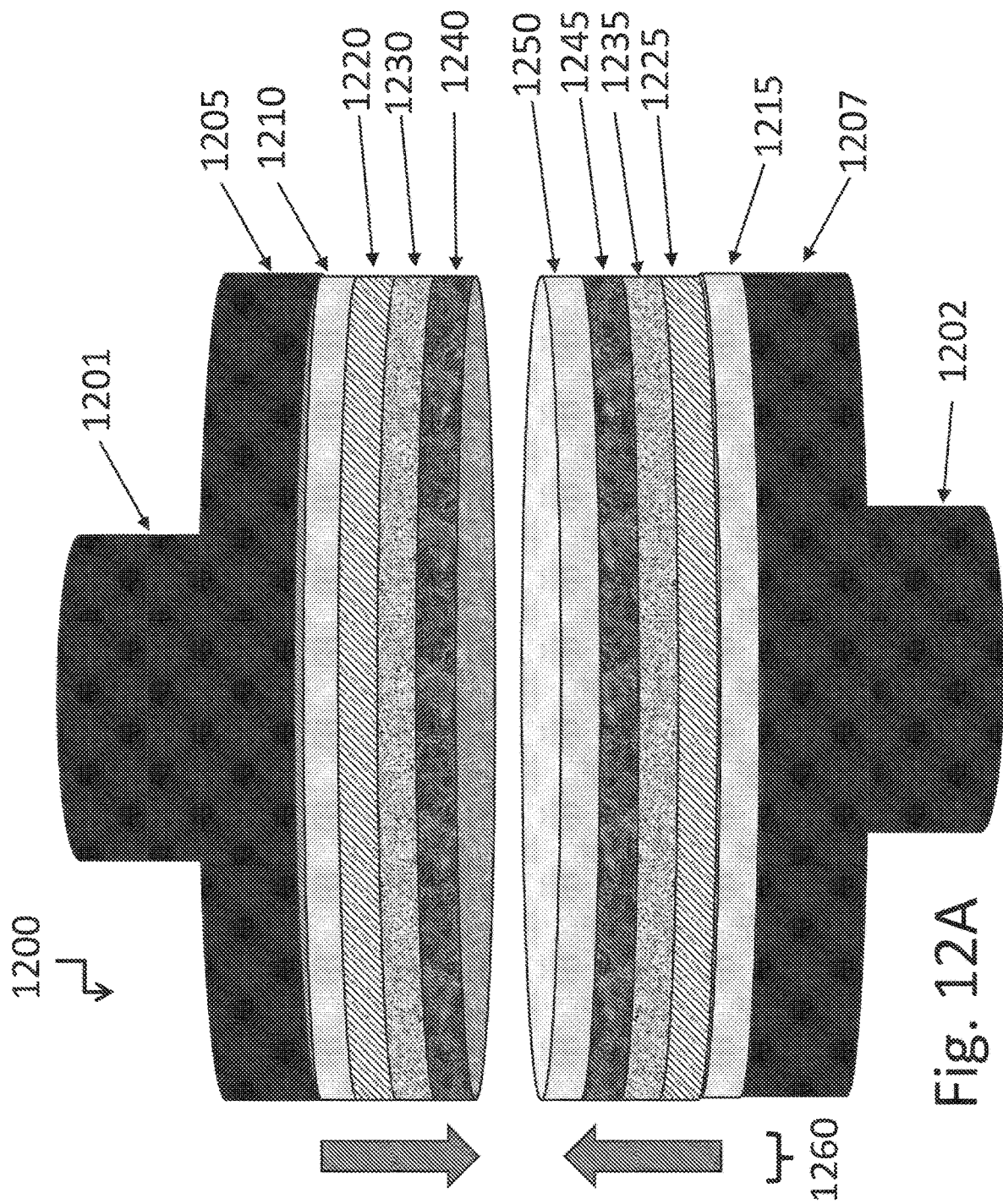
FIG. 12A illustrates an exemplary view of a nominal synthesis chamber with inverted multi-substrate load, according to some embodiments.

As illustrated in FIG. 12A, a nominal synthesis chamber with inverted multi-substrate load 1200 may include at least Top Bonding/Synthesis Force/Hydraulic Cylinder 1201, Top-Side Heater/Platen 1205, Top-side Transition Plate 1210, First Substrate/Wafer 1220, First Sacrificial Diffusion Layer 1230, First Carbon Source 1240, Sandwich Transition Plate 1250, Second Carbon Source 1245, Second Sacrificial Diffusion Layer 1235, Second Substrate/Wafer 1225, Bottom-side Transition Plate 1215, Bottom Side Heater/Platen 1207, and Bottom Bonding/Synthesis Force/Hydraulic Cylinder 1202, with Force Indicators 1260. The inverted multi-substrate load for each process in the one chamber may include Top-side Transition Plate 1210, First Substrate/Wafer 1220, First Sacrificial Diffusion Layer 1230, First Carbon Source 1240, Sandwich Transition Plate 1250, Second Carbon Source 1245, Second Sacrificial Diffusion Layer 1235, Second Substrate/Wafer 1225, Bottom-side Transition Plate 1215, thus processing at least two substrates/wafers for synthesis, such as graphene, in one shot, or processing step, where temperature and pressure may be applied to effect the synthesis, or other desired processing. A prepared substrate may include at least First Substrate/Wafer 1220, First Sacrificial Diffusion Layer 1230, and First Carbon Source 1240, and/or also a prepared substrate may include at least Second Carbon Source 1245, Second Sacrificial Diffusion Layer 1235, and Second Substrate/Wafer 1225.

Top-side Transition Plate 1210, Sandwich Transition Plate 1250, and Bottom-side Transition Plate 1215 may include quartz, generally ultra-pure in quality, parallel faces within fractions of a degree ('wedge'), and at least one face (both faces for Sandwich Transition Plate 1250), that touching First/Second Carbon Source 1240/1245 and/or First/Second Substrate/Wafer 1220/1225, may be flat/smooth and bump/defect free to a high degree. Top-side Transition Plate 1210, Sandwich Transition Plate 1250, and Bottom-side Transition Plate 1215 may rather include various types of high temperature plastics/organic material, which may provide a defect free and force evening spread transition from Top-Side Heater/Platen 1205 to Top-side Transition Plate 1210 and/or Bottom Side Heater/Platen 1207 to Bottom-side Transition Plate 1215.

Transition plates have many uses in the processing described herein. An important application could be to stop/prevent any unwanted reactions from taking place between stacked prepared substrates, so that decoupling the stacked prepared substrates within the stack can easily take place. Theses transition plates could be engineered to be smooth, slick, and unreactive to the compounds and elements which may be touching/contacting the transition plate's surface(s). The transition plates could also include mechanical artifacts to assist the coupling and decoupling process in making or breaking up the stacks of prepared wafers/substrates. For example, such as, small notches on the outside edge of the transition plate so that a mechanism can effectively and reliably grab the transition plate to assist in coupling and decoupling. Other uses of transition plates may be the evening out of the applied forces across the wafers/substrates.

The components within the substrate load for each process in the nominal synthesis chamber with inverted multi-substrate load 1200 may include many types of materials and substrates for various processes which may require temperature and pressure to complete. For this example and others herein, graphene synthesis will be utilized as the exemplary substrate load or loads for processing with temperature and pressure.

Accordingly, First Carbon Source 1240 and Second Carbon Source 1245 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

First Sacrificial Diffusion Layer 1230 and Second Sacrificial Diffusion Layer 1235, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1220 may be coated with a thin layer (50-100 nm) of First Sacrificial Diffusion Layer 1230 and the thickness (volume) of First Carbon Source 1240 may be adjusted due to engineering considerations, especially with respect to but not exclusively due to how much carbon is required to form the desired number of layers of graphene. In a similar manner, Second Substrate/Wafer 1225 may be coated with a thin layer (50-100 nm) of Second Sacrificial Diffusion Layer 1235 and the thickness (volume) of Second Carbon Source 1245 may be adjusted due to engineering considerations, especially with respect to but not exclusively due to how much carbon is required to form the desired number of layers of graphene.

First Substrate/Wafer 1220 and Second Substrate/Wafer 1225 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. First Substrate/Wafer 1220 and Second Substrate/Wafer 1225 need not be similar.

First Substrate/Wafer 1220 and Second Substrate/Wafer 1225 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. First Substrate/Wafer 1220 and Second Substrate/Wafer 1225 may further comprise semiconductor devices such as resistors and capacitors and inductors, one or more programmable interconnects, solar cell structures, memory structures and devices, sensors, radio frequency devices, or optical interconnect with associated transceivers. First Substrate/Wafer 1220 and Second Substrate/Wafer 1225 may further include isolation layers, such as, for example, silicon and/or carbon containing oxides and/or low-k dielectrics and/or polymers, which may electrically isolate, for example, one layer from another layer. First Substrate/Wafer 1220 and Second Substrate/Wafer 1225 may be a wafer, for example, a monocrystalline silicon wafer, or a substrate, for example, a glass substrate.

With reference to at least FIG. 12A herein, an example process flow utilizing exemplary nominal synthesis chamber with inverted multi-substrate load 1200 may be as follows. Preparation of First Substrate/Wafer 1220 and Second Substrate/Wafer 1225: A silicon wafer, which may have transistors and components already processed as discussed above herein, with a silicon oxide (nominally) as a top layer may be prepared as the substrate for graphene synthesis. Coating with First Sacrificial Diffusion Layer 1230 and Second Sacrificial Diffusion Layer 1235: The First Substrate/Wafer 1220 and Second Substrate/Wafer 1225 may be coated with the same or a different thin layer (50-100 nm or more) of transition metal such as Nickel using sputter or e-beam deposition techniques. First Substrate/Wafer 1220 may include a different thickness and/or transition metal than Second Substrate/Wafer 1225. Deposition of first Carbon Source 1240 and Second Carbon Source 1245: Following the deposition of the First/Second Sacrificial Diffusion Layer 1230/1235, a 50-100 nm (or more) layer of amorphous or graphitic powder may be deposited onto the Ni coated First Substrate/Wafer 1220 and Second Substrate/Wafer 1225. This carbon layer can be deposited, for example, using physical sputter, e-beam deposition, or spin-on techniques. High Pressure and Temperature Treatment: The prepared wafers, First Substrate/Wafer 1220 with First Sacrificial Diffusion Layer 1230 and First Carbon Source 1240 onboard, and Second Substrate/Wafer 1225 with Second Sacrificial Diffusion Layer 1235 and Second Carbon Source 1145 onboard may be loaded into nominal synthesis chamber 1200 in the order and orientation shown in FIG. 12A: Second Substrate/Wafer 1225 with Second Sacrificial Diffusion Layer 1235 and Second Carbon Source 1145 may be sandwiched between two quartz plates, such as Bottom-side Transition Plate 1215 and Sandwich Transition Plate 1250, to ensure the uniform distribution of the applied pressure. First Substrate/Wafer 1220 with First Sacrificial Diffusion Layer 1230 and First Carbon Source 1240 may be inverted and then sandwiched between two quartz plates, such as Top-side Transition Plate 1210 and Sandwich Transition Plate 1250, to ensure the uniform distribution of the applied pressure. Thus, First Carbon Source 1240 touches one side of Sandwich Transition Plate 1250 and Second Carbon Source 1145 touches the other side/face of Sandwich Transition Plate 1250. The inverted multi-substrate load may be placed between the Top-Side Heater/Platen 1205 and the Bottom Side Heater/Platen 1207. The temperature of the inverted multi-substrate load may be allowed to stabilize and then, in this example, mechanical pressure may be applied to the substrate load via Top Bonding/Synthesis Force/Hydraulic Cylinder 1201. Generally, but not limited to, Bottom Bonding/Synthesis Force/Hydraulic Cylinder 1202 may be stationary in at least the direction towards the applied force of Top Bonding/Synthesis Force/Hydraulic Cylinder 1201. Force Indicators 1260 indicate the general average directionality of the compression forces experienced by the inverted multi-substrate load.

Under pressure and at elevated temperatures the formation of graphene layers accelerates. The carbon from First Carbon Source 1240 diffuses through the First Sacrificial Diffusion Layer 1230, accumulating on the other side of First Sacrificial Diffusion Layer 1230, specifically at the nickel-silicon oxide (Ni-SiOx) interface. This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the Second prepared Substrate/Wafer 1225: the carbon from Second Carbon Source 1245 diffuses through the Second Sacrificial Diffusion Layer 1235, accumulating on the other side of Second Sacrificial Diffusion Layer 1235, specifically at the nickel-silicon oxide (Ni-SiOx) interface. This accumulation results in the formation of graphene.

The setup shown in FIG. 12A, of nominal synthesis chamber with inverted multi-substrate load 1200, has, in the exemplary configuration shown in FIG. 12A, a double the nominal throughput surface of the nominal setup described in FIG. 11 herein. We will call this a throughput of 2 (wafers/hour) for a given graphene process at whatever temperature and pressure is chosen to form the SLG or MLG desired. However, nominal synthesis chamber with inverted multi-substrate load 1200 may be loaded with more than 2 wafers per process 'shot.' The synthesis chamber could be loaded with multiples of the inverted and non-inverted doublet of prepared substrates/wafers. Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1205 and the Bottom Side Heater/Platen 1207 and all the prepared substrates/wafers and Transition Plates, much like an automotive internal combustion engine cylinder keeping the piston and rings aligned and centered when traveling the length of the piston cylinder. A longitudinal slot or slots may also provide a release mechanism. Thus, the 'throughput' of this configuration could be 4 or 6 or 8 or 10 or 20 or 50 or 100 times that of the nominal FIG. 11 configuration. Accordingly, the number of prepared substrates/wafers per load may be 4 or 6 or 8 or 10 or 20 or 50 or 100. Odd numbers may be obtained by simply adding half of a doublet (inverted and non-inverted) on either 'end' of the load stack. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm.

Figure 12B:
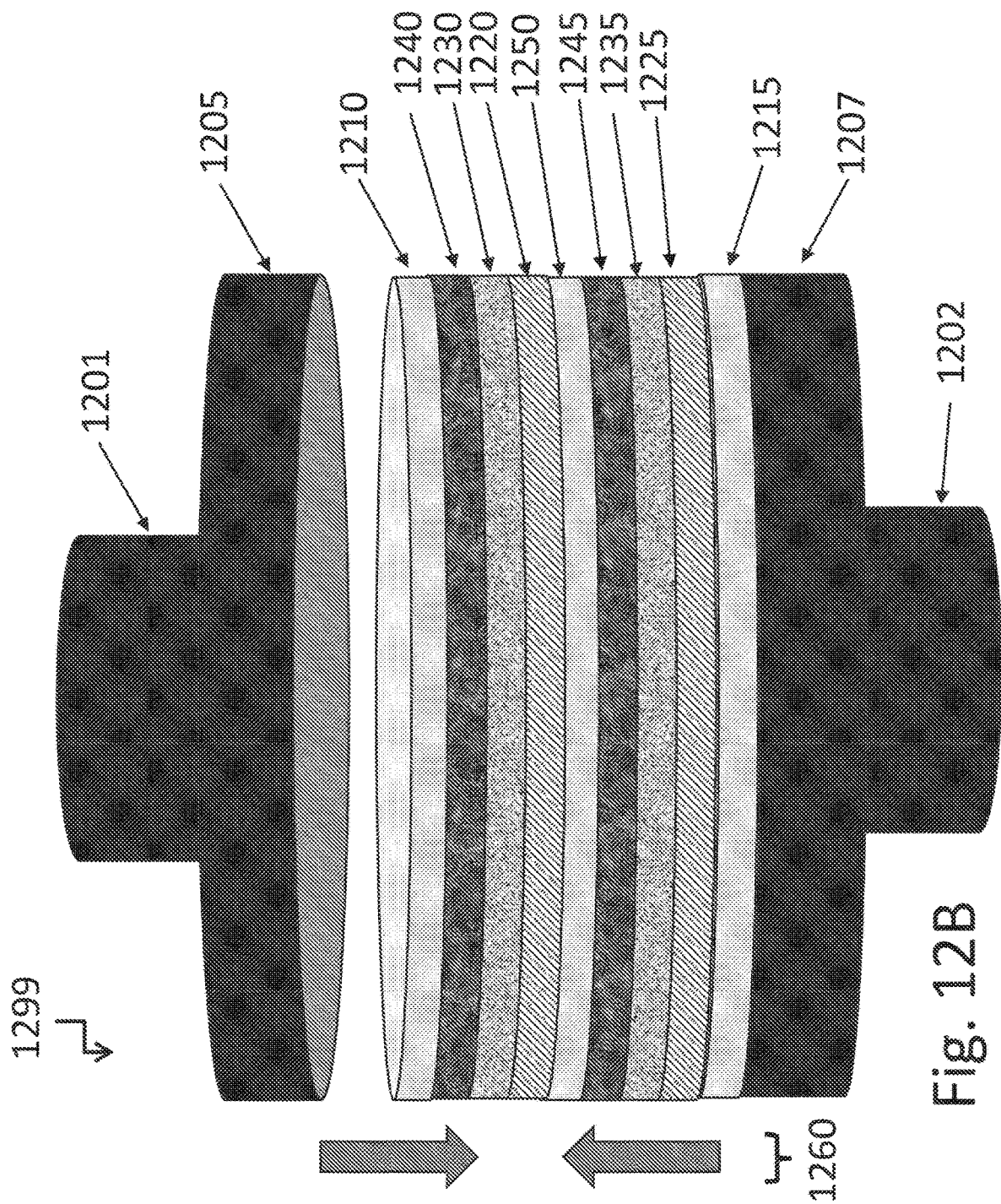
FIG. 12B illustrates an exemplary view of a nominal synthesis chamber with transition plated multi-substrate load, according to some embodiments.

As illustrated in FIG. 12B, a nominal synthesis chamber with transition plated multi-substrate load 1299 may include at least Top Bonding/Synthesis Force/Hydraulic Cylinder 1201, Top-Side Heater/Platen 1205, Top-side Transition Plate 1210, First Carbon Source 1240, First Sacrificial Diffusion Layer 1230, First Substrate/Wafer 1220, Sandwich Transition Plate 1250, Second Carbon Source 1245, Second Sacrificial Diffusion Layer 1235, Second Substrate/Wafer 1225, Bottom-side Transition Plate 1215, Bottom Side Heater/Platen 1207, and Bottom Bonding/Synthesis Force/Hydraulic Cylinder 1202, with Force Indicators 1260. The transition plated multi-substrate load for each process in the one chamber may include Top-side Transition Plate 1210, First Carbon Source 1240, First Sacrificial Diffusion Layer 1230, First Substrate/Wafer 1220, Sandwich Transition Plate 1250, Second Carbon Source 1245, Second Sacrificial Diffusion Layer 1235, Second Substrate/Wafer 1225, Bottom-side Transition Plate 1215, thus processing at least two substrates/wafers for synthesis, such as graphene, in one shot, or processing step, where temperature and pressure may be applied to effect the synthesis, or other desired processing. A prepared substrate may include at least First Substrate/Wafer 1220, First Sacrificial Diffusion Layer 1230, and First Carbon Source 1240, and/or also a prepared substrate may include at least Second Carbon Source 1245, Second Sacrificial Diffusion Layer 1235, and Second Substrate/Wafer 1225.

Top-side Transition Plate 1210, Sandwich Transition Plate 1250, and Bottom-side Transition Plate 1215 may include quartz, generally ultra-pure in quality, parallel faces within fractions of a degree ('wedge'), and at least one face (both faces for Sandwich Transition Plate 1250), that touching First/Second Carbon Source 1240/1245 and/or First/Second Substrate/Wafer 1220/1225, may be flat/smooth and bump/defect free to a high degree. Top-side Transition Plate 1210, Sandwich Transition Plate 1250, and Bottom-side Transition Plate 1215 may rather include various types of high temperature plastics/organic material, which may provide a defect free and force evening spread transition from Top-Side Heater/Platen 1205 to Top-side Transition Plate 1210 and/or Bottom Side Heater/Platen 1207 to Bottom-side Transition Plate 1215.

Transition plates have many uses in the processing described herein. An important application could be to stop/prevent any unwanted reactions from taking place between stacked prepared substrates, so that decoupling the stacked prepared substrates within the stack can easily take place. Theses transition plates could be engineered to be smooth, slick, and unreactive to the compounds and elements which may be touching/contacting the transition plate's surface(s). The transition plates could also include mechanical artifacts to assist the coupling and decoupling process in making or breaking up the stacks of prepared wafers/substrates. For example, such as, small notches on the outside edge of the transition plate so that a mechanism can effectively and reliably grab the transition plate to assist in coupling and decoupling. Other uses of transition plates may be the evening out of the applied forces across the wafers/substrates.

The components within the substrate load for each process in the nominal synthesis chamber with transition plated multi-substrate load 1299 may include many types of materials and substrates for various processes which may require temperature and pressure to complete. For this example and others herein, graphene synthesis will be utilized as the exemplary substrate load or loads for processing with temperature and pressure.

Accordingly, First Carbon Source 1240 and Second Carbon Source 1245 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

First Sacrificial Diffusion Layer 1230 and Second Sacrificial Diffusion Layer 1235, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1220 may be coated with a thin layer (50-100 nm) of First Sacrificial Diffusion Layer 1230 and the thickness (volume) of First Carbon Source 1240 may be adjusted due to engineering considerations, especially with respect to but not exclusively due to how much carbon is required to form the desired number of layers of graphene. In a similar manner, Second Substrate/Wafer 1225 may be coated with a thin layer (50-100 nm) of Second Sacrificial Diffusion Layer 1235 and the thickness (volume) of Second Carbon Source 1245 may be adjusted due to engineering considerations, especially with respect to but not exclusively due to how much carbon is required to form the desired number of layers of graphene.

First Substrate/Wafer 1220 and Second Substrate/Wafer 1225 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. First Substrate/Wafer 1220 and Second Substrate/Wafer 1225 need not be similar.

First Substrate/Wafer 1220 and Second Substrate/Wafer 1225 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. First Substrate/Wafer 1220 and Second Substrate/Wafer 1225 may further comprise semiconductor devices such as resistors and capacitors and inductors, one or more programmable interconnects, solar cell structures, memory structures and devices, sensors, radio frequency devices, or optical interconnect with associated transceivers. First Substrate/Wafer 1220 and Second Substrate/Wafer 1225 may further include isolation layers, such as, for example, silicon and/or carbon containing oxides and/or low-k dielectrics and/or polymers, which may electrically isolate, for example, one layer from another layer. First Substrate/Wafer 1220 and Second Substrate/Wafer 1225 may be a wafer, for example, a monocrystalline silicon wafer, or a substrate, for example, a glass substrate.

With reference to at least FIG. 12B herein, an example process flow utilizing exemplary nominal synthesis chamber with transition plated multi-substrate load 1299 may be as follows. Preparation of First Substrate/Wafer 1220 and Second Substrate/Wafer 1225: A silicon wafer, which may have transistors and components already processed as discussed above herein, with a silicon oxide (nominally) as a top layer may be prepared as the substrate for graphene synthesis. Coating with First Sacrificial Diffusion Layer 1230 and Second Sacrificial Diffusion Layer 1235: The First Substrate/Wafer 1220 and Second Substrate/Wafer 1225 may be coated with the same or a different thin layer (50-100 nm or more) of transition metal such as Nickel using sputter or e-beam deposition techniques. First Substrate/Wafer 1220 may include a different thickness and/or transition metal than Second Substrate/Wafer 1225. Deposition of first Carbon Source 1240 and Second Carbon Source 1245: Following the deposition of the First/Second Sacrificial Diffusion Layer 1230/1235, a 50-100 nm (or more) layer of amorphous or graphitic powder may be deposited onto the Ni coated First Substrate/Wafer 1220 and Second Substrate/Wafer 1225. This carbon layer can be deposited, for example, using physical sputter, e-beam deposition, or spin-on techniques. High Pressure and Temperature Treatment: The prepared wafers, First Substrate/Wafer 1220 with First Sacrificial Diffusion Layer 1230 and First Carbon Source 1240 onboard, and Second Substrate/Wafer 1225 with Second Sacrificial Diffusion Layer 1235 and Second Carbon Source 1245 onboard may be loaded into nominal synthesis chamber 1200 in the order and orientation shown in FIG. 12B: Second Substrate/Wafer 1225 with Second Sacrificial Diffusion Layer 1235 and Second Carbon Source 1245 may be sandwiched between two quartz plates, such as Bottom-side Transition Plate 1215 and Sandwich Transition Plate 1250, to ensure the uniform distribution of the applied pressure. First Substrate/Wafer 1220 with First Sacrificial Diffusion Layer 1230 and First Carbon Source 1240 may be faced in the same direction as Second Substrate/Wafer 1225 and then sandwiched between two quartz plates, such as Top-side Transition Plate 1210 and Sandwich Transition Plate 1250, to ensure the uniform distribution of the applied pressure. Thus, First Substrate/Wafer 1220 touches one side of Sandwich Transition Plate 1250 and Second Carbon Source 1245 touches the other side/face of Sandwich Transition Plate 1250. The transition sandwiched multi-substrate load may be placed between the Top-Side Heater/Platen 1205 and the Bottom Side Heater/Platen 1207. The temperature of the inverted multi-substrate load may be allowed to stabilize and then, in this example, mechanical pressure may be applied to the substrate load via Top Bonding/Synthesis Force/Hydraulic Cylinder 1201. Generally, but not limited to, Bottom Bonding/Synthesis Force/Hydraulic Cylinder 1202 may be stationary in at least the direction towards the applied force of Top Bonding/Synthesis Force/Hydraulic Cylinder 1201. Force Indicators 1260 indicate the general average directionality of the compression forces experienced by the inverted multi-substrate load.

Under pressure and at elevated temperatures the formation of graphene layers accelerates. The carbon from First Carbon Source 1240 diffuses through the First Sacrificial Diffusion Layer 1230, accumulating on the other side of First Sacrificial Diffusion Layer 1230, specifically at the nickel-silicon oxide (Ni-SiOx) interface. This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the Second prepared Substrate/Wafer 1225: the carbon from Second Carbon Source 1245 diffuses through the Second Sacrificial Diffusion Layer 1235, accumulating on the other side of Second Sacrificial Diffusion Layer 1235, specifically at the nickel-silicon oxide (Ni-SiOx) interface. This accumulation results in the formation of graphene.

The setup shown in FIG. 12B, of nominal synthesis chamber with transition plated multi-substrate load 1299, has, in the exemplary configuration shown in FIG. 12B, a double the nominal throughput surface of the nominal setup described in FIG. 11 herein. We will call this a throughput of 2 (wafers/hour) for a given graphene process at whatever temperature and pressure is chosen to form the SLG or MLG desired. However, nominal synthesis chamber with transition plated multi-substrate load 1299 may be loaded with more than 2 wafers per process 'shot.' The synthesis chamber could be loaded with multiples of the non-inverted doublet of prepared substrates/wafers (and the desired transition plates). Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1205 and the Bottom Side Heater/Platen 1207 and all the prepared substrates/wafers and Transition Plates, much like an automotive internal combustion engine cylinder keeping the piston and rings aligned and centered when traveling the length of the piston cylinder. A longitudinal slot or slots may also provide a release mechanism. Thus, the 'throughput' of this configuration could be 3, 4 or 5, 6 or 8 or 10, 11 or 20 or 25 or 50 or 61 or 100 times that of the nominal FIG. 11 configuration. Accordingly, the number of prepared substrates/wafers per load may be 3, 4 or 5, 6 or 8 or 10, 11 or 20 or 25 or 50 or 61 or 100. Odd numbers may be obtained by simply adding half of a doublet (inverted and non-inverted) on either 'end' of the load stack. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm. The inverted and non-inverted methods described in at least FIGS. 12A and 12B herein may be mixed and matched.

Figure 13A:
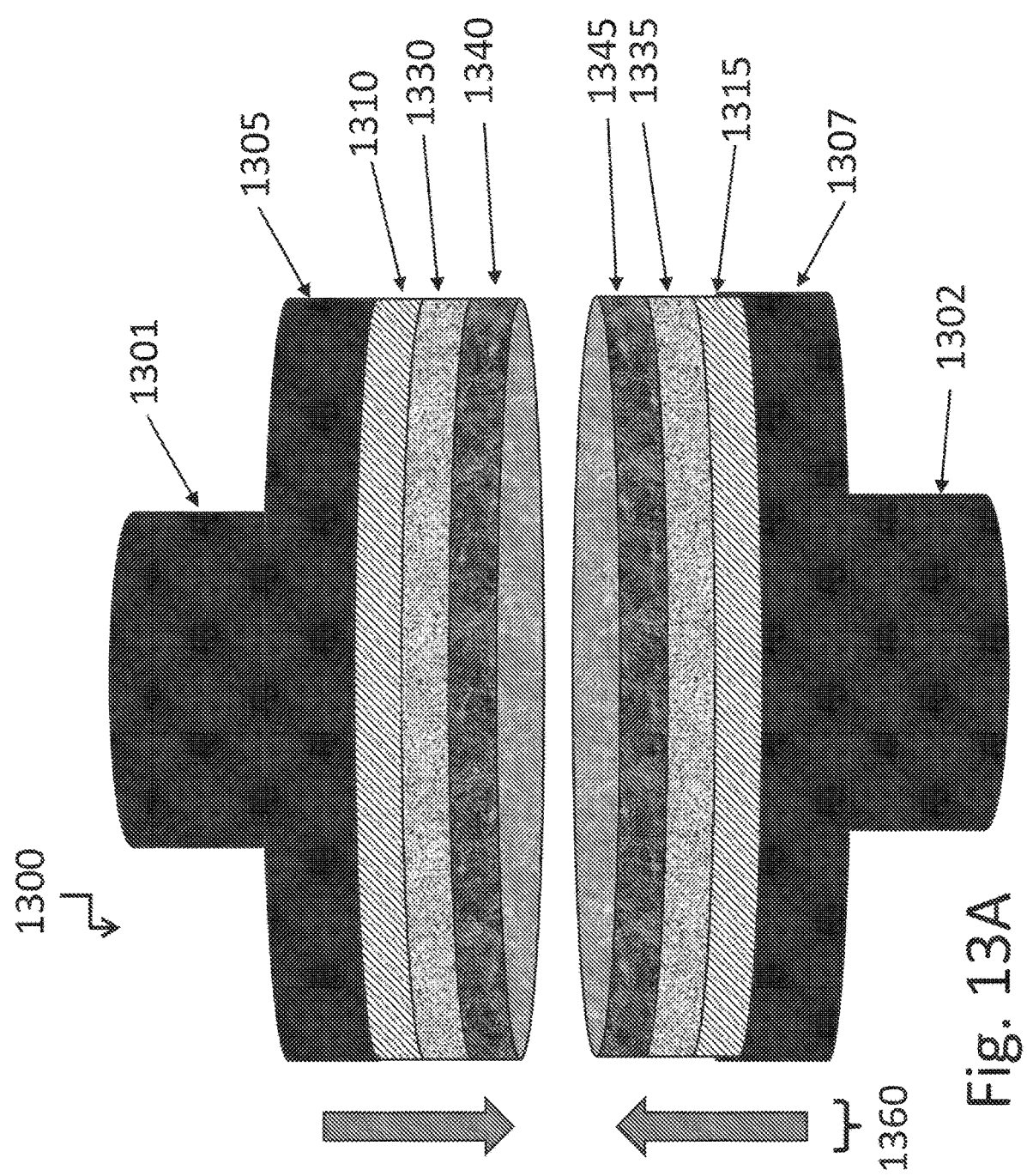
FIG. 13A illustrates an exemplary view of a nominal synthesis chamber with a mixed inverted multi-substrate load, according to some embodiments.

As illustrated in FIG. 13A, a nominal synthesis chamber with a mixed inverted multi-substrate load 1300 may include at least Top Bonding/Synthesis Force/Hydraulic Cylinder 1301, Top-Side Heater/Platen 1305, First Substrate/Wafer 1310, First Sacrificial Diffusion Layer 1330, First Carbon Source 1340, Second Carbon Source 1345, Second Sacrificial Diffusion Layer 1335, Second Substrate/Wafer 1315, Bottom Side Heater/Platen 1307, and Bottom Bonding/Synthesis Force/Hydraulic Cylinder 1302, with Force Indicators 1360. The multi-substrate load for each process in the one chamber may include First Substrate/Wafer 1310, First Sacrificial Diffusion Layer 1330, First Carbon Source 1340, Second Carbon Source 1345, Second Sacrificial Diffusion Layer 1335, Second Substrate/Wafer 1315, thus processing at least two substrates/wafers for synthesis, such as graphene, in one shot, or processing step, where temperature and pressure may be applied to effect the synthesis, or other desired processing. A prepared substrate may include at least First Substrate/Wafer 1310, First Sacrificial Diffusion Layer 1330, and First Carbon Source 1340, and/or also a prepared substrate may include at least Second Carbon Source 1345, Second Sacrificial Diffusion Layer 1335, and Second Substrate/Wafer 1315.

The components within the substrate load for each process in the nominal synthesis chamber with a mixed inverted multi-substrate load 1300 may include many types of materials and substrates for various processes which may require temperature and pressure to complete. For this example and others herein, graphene synthesis will be utilized as the exemplary substrate load or loads for processing with temperature and pressure.

Accordingly, First Carbon Source 1340 and Second Carbon Source 1345 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

First Sacrificial Diffusion Layer 1330 and Second Sacrificial Diffusion Layer 1335, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1310 may be coated with a thin layer (50-100 nm) of First Sacrificial Diffusion Layer 1330 and the thickness (volume) of First Carbon Source 1340 may be adjusted due to engineering considerations, especially with respect to but not exclusively due to how much carbon is required to form the desired number of layers of graphene. In a similar manner, Second Substrate/Wafer 1315 may be coated with a thin layer (50-100 nm) of Second Sacrificial Diffusion Layer 1335 and the thickness (volume) of Second Carbon Source 1345 may be adjusted due to engineering considerations, especially with respect to but not exclusively due to how much carbon is required to form the desired number of layers of graphene.

First Substrate/Wafer 1310 and Second Substrate/Wafer 1315 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. First Substrate/Wafer 1310 and Second Substrate/Wafer 1315 need not be similar.

First Substrate/Wafer 1310 and Second Substrate/Wafer 1315 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. First Substrate/Wafer 1310 and Second Substrate/Wafer 1315 may further comprise semiconductor devices such as resistors and capacitors and inductors, one or more programmable interconnects, solar cell structures, memory structures and devices, sensors, radio frequency devices, or optical interconnect with associated transceivers. First Substrate/Wafer 1310 and Second Substrate/Wafer 1315 may further include isolation layers, such as, for example, silicon and/or carbon containing oxides and/or low-k dielectrics and/or polymers, which may electrically isolate, for example, one layer from another layer. First Substrate/Wafer 1310 and Second Substrate/Wafer 1315 may be a wafer, for example, a monocrystalline silicon wafer, or a substrate, for example, a glass substrate.

With reference to at least FIG. 13A herein, an example process flow utilizing exemplary nominal synthesis chamber with a mixed inverted multi-substrate load 1300 may be as follows. Preparation of First Substrate/Wafer 1310 and Second Substrate/Wafer 1315: A silicon wafer, which may have transistors and components already processed as discussed above herein, with a silicon oxide (nominally) as a top layer may be prepared as the substrate for graphene synthesis. Coating with First Sacrificial Diffusion Layer 1330 and Second Sacrificial Diffusion Layer 1335: The First Substrate/Wafer 1310 and Second Substrate/Wafer 1315 may be coated with the same or a different thin layer (50-100 nm or more) of transition metal such as Nickel using sputter or e-beam deposition techniques. First Substrate/Wafer 1310 may include a different thickness and/or transition metal than Second Substrate/Wafer 1315. Deposition of first Carbon Source 1340 and Second Carbon Source 1345: Following the deposition of the First/Second Sacrificial Diffusion Layer 1330/1335, a 50-100 nm (or more) layer of amorphous or graphitic powder may be deposited onto the Ni coated First Substrate/Wafer 1310 and Second Substrate/Wafer 1315. This carbon layer can be deposited, for example, using physical sputter, e-beam deposition, or spin-on techniques. High Pressure and Temperature Treatment: The prepared wafers, First Substrate/Wafer 1310 with First Sacrificial Diffusion Layer 1330 and First Carbon Source 1340 onboard, and Second Substrate/Wafer 1315 with Second Sacrificial Diffusion Layer 1335 and Second Carbon Source 1345 onboard may be loaded into nominal synthesis chamber 1300 in the order and orientation shown in FIG. 13A: Second Substrate/Wafer 1315 with Second Sacrificial Diffusion Layer 1335 and Second Carbon Source 1345 may be placed into a stack preparation device (not shown) face-up, meaning the backside of Second Substrate/Wafer 1315 is facing downwards and Second Carbon Source 1345 is thusly facing upwards. Then, First Substrate/Wafer 1310 with First Sacrificial Diffusion Layer 1330 and First Carbon Source 1340 may be inverted and place on top of the prepared second wafer. Thus, First Carbon Source 1340 is in direct contact with Second Carbon Source 1345. This type of 'pair' may be repeated one or more times. As well, there could be pairs and singles in the load. The inverted multi-substrate load may be placed between the Top-Side Heater/Platen 1305 and the Bottom Side Heater/Platen 1307 and then aligned and lightly clamped. The temperature of the mixed inverted multi-substrate load may be allowed to stabilize and then, in this example, mechanical pressure may be applied to the substrate load via Top Bonding/Synthesis Force/Hydraulic Cylinder 1301. Generally, but not limited to, Bottom Bonding/Synthesis Force/Hydraulic Cylinder 1302 may be stationary in at least the direction towards the applied force of Top Bonding/Synthesis Force/Hydraulic Cylinder 1301. Force Indicators 1360 indicate the general average directionality of the compression forces experienced by the mixed inverted multi-substrate load.

Under pressure and at elevated temperatures the formation of graphene layers accelerates. The carbon from First Carbon Source 1340 diffuses at least through the First Sacrificial Diffusion Layer 1330, accumulating on the other side of First Sacrificial Diffusion Layer 1330, specifically at the nickel-silicon oxide (Ni-SiOx) interface. This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the Second prepared Substrate/Wafer 1315: the carbon from at least Second Carbon Source 1345 diffuses through the Second Sacrificial Diffusion Layer 1335, accumulating on the other side of Second Sacrificial Diffusion Layer 1335, specifically at the nickel-silicon oxide (Ni-SiOx) interface. This accumulation results in the formation of graphene.

The setup shown in FIG. 13A, of nominal synthesis chamber with a mixed inverted multi-substrate load 1300, has, in the exemplary configuration shown in FIG. 13A, a double the nominal throughput surface of the nominal setup described in FIG. 11 herein. We will call this a throughput of 2 (wafers/hour) for a given graphene process at whatever temperature and pressure is chosen to form the SLG or MLG desired. However, nominal synthesis chamber with a mixed inverted multi-substrate load 1300 may be loaded with more than 2 wafers/substrates per process 'shot.' The synthesis chamber could be loaded with multiples of the inverted doublet of prepared substrates/wafers (and any desired transition plates, not shown). Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1305 and the Bottom Side Heater/Platen 1307 and all the prepared substrates/wafers and Transition Plates, much like an automotive internal combustion engine cylinder keeping the piston and rings aligned and centered when traveling the length of the piston cylinder. A longitudinal slot or slots may also provide a release mechanism. Thus, the 'throughput' of this configuration could be 3, 4 or 5, 6 or 8 or 10, 11 or 20 or 25 or 50 or 61 or 100 times that of the nominal FIG. 11 configuration. Accordingly, the number of prepared substrates/wafers per load may be 3, 4 or 5, 6 or 8 or 10, 11 or 20 or 25 or 50 or 61 or 100. Odd numbers may be obtained by simply adding half of a doublet (inverted and non-inverted) on either 'end' of the load stack. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm.

Figure 13B:
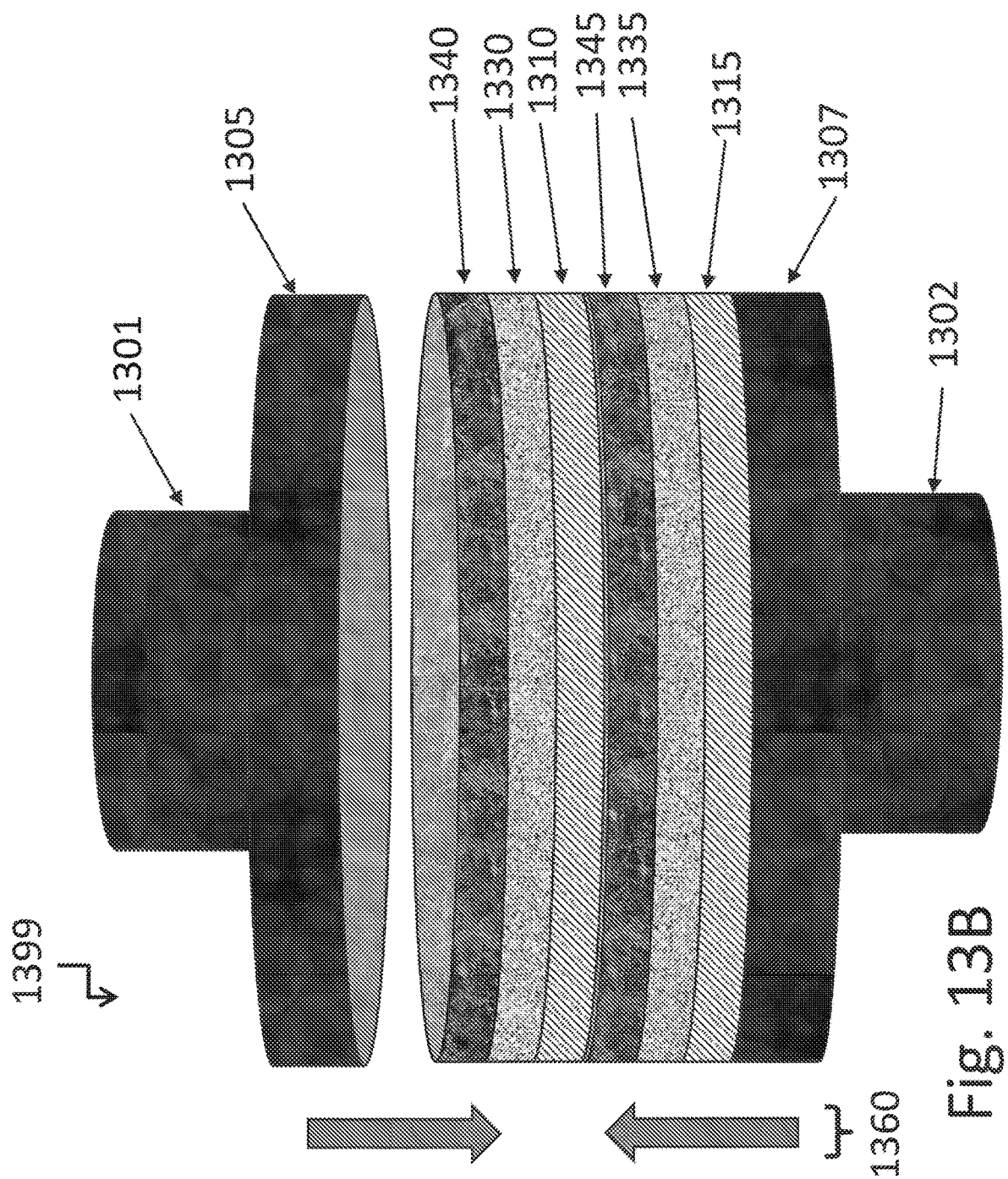
FIG. 13B illustrates an exemplary view of a nominal synthesis chamber with a non-inverted multi-substrate load, according to some embodiments.

As illustrated in FIG. 13B, a nominal synthesis chamber with a non-inverted multi-substrate load 1399 may include at least Top Bonding/Synthesis Force/Hydraulic Cylinder 1301, Top-Side Heater/Platen 1305, First Substrate/Wafer 1310, First Sacrificial Diffusion Layer 1330, First Carbon Source 1340, Second Carbon Source 1345, Second Sacrificial Diffusion Layer 1335, Second Substrate/Wafer 1315, Bottom Side Heater/Platen 1307, and Bottom Bonding/Synthesis Force/Hydraulic Cylinder 1302, with Force Indicators 1360. The multi-substrate load for each process in the one chamber may include First Substrate/Wafer 1310, First Sacrificial Diffusion Layer 1330, First Carbon Source 1340, Second Carbon Source 1345, Second Sacrificial Diffusion Layer 1335, Second Substrate/Wafer 1315, thus processing at least two substrates/wafers for synthesis, such as graphene, in one shot, or processing step, where temperature and pressure may be applied to effect the synthesis, or other desired processing. A prepared substrate may include at least First Substrate/Wafer 1310, First Sacrificial Diffusion Layer 1330, and First Carbon Source 1340, and/or also a prepared substrate may include at least Second Carbon Source 1345, Second Sacrificial Diffusion Layer 1335, and Second Substrate/Wafer 1315.

The components within the substrate load for each process in the nominal synthesis chamber with a non-inverted multi-substrate load 1399 may include many types of materials and substrates for various processes which may require temperature and pressure to complete. For this example and others herein, graphene synthesis will be utilized as the exemplary substrate load or loads for processing with temperature and pressure.

Accordingly, First Carbon Source 1340 and Second Carbon Source 1345 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

First Sacrificial Diffusion Layer 1330 and Second Sacrificial Diffusion Layer 1335, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1310 may be coated with a thin layer (50-100 nm) of First Sacrificial Diffusion Layer 1330 and the thickness (volume) of First Carbon Source 1340 may be adjusted due to engineering considerations, especially with respect to but not exclusively due to how much carbon is required to form the desired number of layers of graphene. In a similar manner, Second Substrate/Wafer 1315 may be coated with a thin layer (50-100 nm) of Second Sacrificial Diffusion Layer 1335 and the thickness (volume) of Second Carbon Source 1345 may be adjusted due to engineering considerations, especially with respect to but not exclusively due to how much carbon is required to form the desired number of layers of graphene.

First Substrate/Wafer 1310 and Second Substrate/Wafer 1315 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. First Substrate/Wafer 1310 and Second Substrate/Wafer 1315 need not be similar.

First Substrate/Wafer 1310 and Second Substrate/Wafer 1315 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. First Substrate/Wafer 1310 and Second Substrate/Wafer 1315 may further comprise semiconductor devices such as resistors and capacitors and inductors, one or more programmable interconnects, solar cell structures, memory structures and devices, sensors, radio frequency devices, or optical interconnect with associated transceivers. First Substrate/Wafer 1310 and Second Substrate/Wafer 1315 may further include isolation layers, such as, for example, silicon and/or carbon containing oxides and/or low-k dielectrics and/or polymers, which may electrically isolate, for example, one layer from another layer. First Substrate/Wafer 1310 and Second Substrate/Wafer 1315 may be a wafer, for example, a monocrystalline silicon wafer, or a substrate, for example, a glass substrate.

With reference to at least FIG. 13B herein, an example process flow utilizing exemplary nominal synthesis chamber with a non-inverted multi-substrate load 1399 may be as follows. Preparation of First Substrate/Wafer 1310 and Second Substrate/Wafer 1315: A silicon wafer, which may have transistors and components already processed as discussed above herein, with a silicon oxide (nominally) as a top layer may be prepared as the substrate for graphene synthesis. Coating with First Sacrificial Diffusion Layer 1330 and Second Sacrificial Diffusion Layer 1335: The First Substrate/Wafer 1310 and Second Substrate/Wafer 1315 may be coated with the same or a different thin layer (50-100 nm or more) of transition metal such as Nickel using sputter or e-beam deposition techniques. First Substrate/Wafer 1310 may include a different thickness and/or transition metal than Second Substrate/Wafer 1315. Deposition of first Carbon Source 1340 and Second Carbon Source 1345: Following the deposition of the First/Second Sacrificial Diffusion Layer 1330/1335, a 50-100 nm (or more) layer of amorphous or graphitic powder may be deposited onto the Ni coated First Substrate/Wafer 1310 and Second Substrate/Wafer 1315. This carbon layer can be deposited, for example, using physical sputter, e-beam deposition, or spin-on techniques. High Pressure and Temperature Treatment: The prepared wafers, First Substrate/Wafer 1310 with First Sacrificial Diffusion Layer 1330 and First Carbon Source 1340 onboard, and Second Substrate/Wafer 1315 with Second Sacrificial Diffusion Layer 1335 and Second Carbon Source 1345 onboard may be loaded into nominal synthesis chamber 1399 in the order and orientation shown in FIG. 13B: Second Substrate/Wafer 1315 with Second Sacrificial Diffusion Layer 1335 and Second Carbon Source 1345 may be placed into a stack preparation device (not shown) face-up, meaning the backside of Second Substrate/Wafer 1315 is facing downwards and Second Carbon Source 1345 is thusly facing upwards. Then, First Substrate/Wafer 1310 with First Sacrificial Diffusion Layer 1330 and First Carbon Source 1340 may be placed on top of the prepared second wafer in the same facing direction, which in the case of FIG. 13B is both upwards, but could rather be both facing downwards. Thus, Second Carbon Source 1340 may be in direct contact with the backside of First Substrate/Wafer 1310. This type of 'pair' may be repeated one or more times. As well, there could be pairs and singles in the load. The non-inverted multi-substrate load may be placed between the Top-Side Heater/Platen 1305 and the Bottom Side Heater/Platen 1307 and then aligned and lightly clamped. The temperature of the non-inverted multi-substrate load may be allowed to stabilize and then, in this example, mechanical pressure may be applied to the substrate load via Top Bonding/Synthesis Force/Hydraulic Cylinder 1301. Generally, but not limited to, Bottom Bonding/Synthesis Force/Hydraulic Cylinder 1302 may be stationary in at least the direction towards the applied force of Top Bonding/Synthesis Force/Hydraulic Cylinder 1301. Force Indicators 1360 indicate the general average directionality of the compression forces experienced by the non-inverted multi-substrate load.

Under pressure and at elevated temperatures the formation of graphene layers accelerates. The carbon from First Carbon Source 1340 diffuses at least through the First Sacrificial Diffusion Layer 1330, accumulating on the other side of First Sacrificial Diffusion Layer 1330, specifically at the nickel-silicon oxide (Ni-SiOx) interface. This accumulation results in the formation of graphene. The graphene formed can be single-layer (SLG) or multi-layer (MLG), depending on the process parameters and conditions. Gravity, the weakest of the fundamental forces, is a negligible effect on this process, so non-inversion/inversion does provide any meaningful difference in result. Similar formation will occur on the Second prepared Substrate/Wafer 1315: the carbon from at least Second Carbon Source 1345 diffuses through the Second Sacrificial Diffusion Layer 1335, accumulating on the other side of Second Sacrificial Diffusion Layer 1335, specifically at the nickel-silicon oxide (Ni-SiOx) interface. This accumulation results in the formation of graphene.

The setup shown in FIG. 13B, of nominal synthesis chamber with a non-inverted multi-substrate load 1399, has, in the exemplary configuration shown in FIG. 13B, a double the nominal throughput surface of the nominal setup described in FIG. 11 herein. We will call this a throughput of 2 (wafers/hour) for a given graphene process at whatever temperature and pressure is chosen to form the SLG or MLG desired. However, nominal synthesis chamber with a non-inverted multi-substrate load 1399 may be loaded with more than 2 wafers/substrates per process 'shot.' The synthesis chamber could be loaded with multiples of the doublet/pair of prepared substrates/wafers (and any desired transition plates, not shown). Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1305 and the Bottom Side Heater/Platen 1307 and all the prepared substrates/wafers (and Transition Plates, if utilized), much like an automotive internal combustion engine cylinder keeping the piston and rings aligned and centered when traveling the length of the piston cylinder. A longitudinal slot or slots may also provide a release mechanism. Thus, the 'throughput' of this configuration could be 3, 4 or 5, 6 or 8 or 10, 11 or 20 or 25 or 50 or 61 or 100 times that of the nominal FIG. 11 configuration. Accordingly, the number of prepared substrates/wafers per load may be 3, 4 or 5, 6 or 8 or 10, 11 or 20 or 25 or 50 or 61 or 100. Odd numbers may be obtained by simply adding half of a doublet (non-inverted) on either 'end' of the load stack. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm. The inverted and non-inverted methods described in at least FIGS. 13A and 13B herein may be mixed and matched.

Figure 14A:
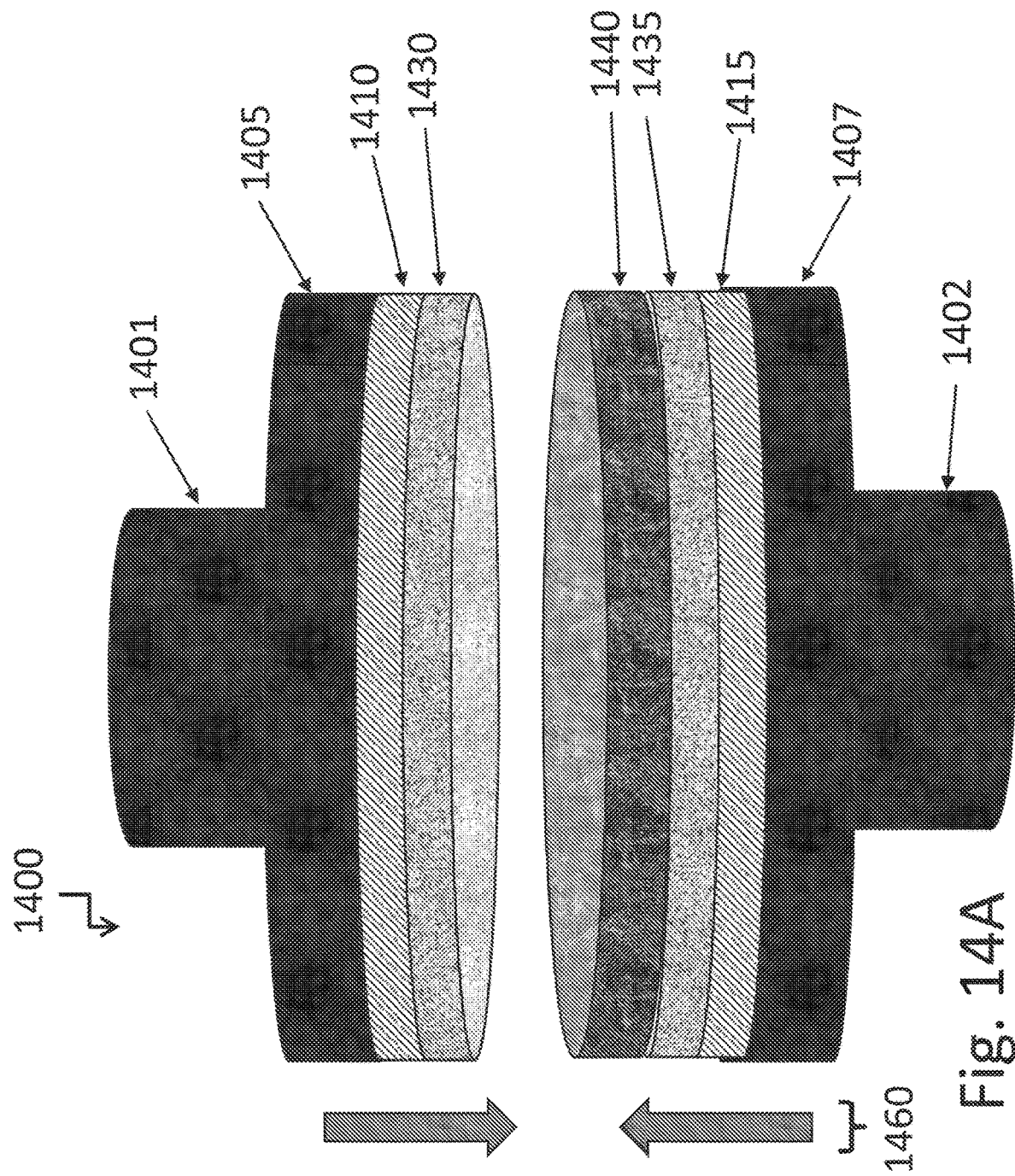
FIG. 14A illustrates an exemplary view a nominal synthesis chamber with a minimalist inverted multi-substrate load, according to some embodiments.

As illustrated in FIG. 14A, a nominal synthesis chamber with a minimalist inverted multi-substrate load 1400 may include at least Top Bonding/Synthesis Force/Hydraulic Cylinder 1401, Top-Side Heater/Platen 1405, First Substrate/Wafer 1410, First Sacrificial Diffusion Layer 1430, Shared Carbon Source 1440, Second Sacrificial Diffusion Layer 1435, Second Substrate/Wafer 1415, Bottom Side Heater/Platen 1407, and Bottom Bonding/Synthesis Force/Hydraulic Cylinder 1402, with Force Indicators 1460. The multi-substrate load for each process in the one chamber may include First Substrate/Wafer 1410, First Sacrificial Diffusion Layer 1430, Shared Carbon Source 1440, Second Sacrificial Diffusion Layer 1435, and Second Substrate/Wafer 1415, thus processing at least two substrates/wafers for synthesis, such as graphene, in one shot, or processing step, where temperature and pressure may be applied to effect the synthesis, or other desired processing. A prepared substrate may include at least First Substrate/Wafer 1410 and First Sacrificial Diffusion Layer 1430, and/or also a prepared substrate may include at least Shared Carbon Source 1440, Second Sacrificial Diffusion Layer 1435, and Second Substrate/Wafer 1415. Note: Shared Carbon Source 1440 may be located on either of the prepared substrates.

The components within the substrate load for each process in the nominal synthesis chamber with a minimalist inverted multi-substrate load 1400 may include many types of materials and substrates for various processes which may require temperature and pressure to complete. For this example and others herein, graphene synthesis will be utilized as the exemplary substrate load or loads for processing with temperature and pressure.

Accordingly, Shared Carbon Source 1440 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

First Sacrificial Diffusion Layer 1430 and Second Sacrificial Diffusion Layer 1435, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1410 may be coated with a thin layer (50-100 nm) of First Sacrificial Diffusion Layer 1430 and the thickness (volume) of Shared Carbon Source 1440 may be adjusted due to engineering considerations, especially with respect to but not exclusively due to how much carbon is required to form the desired number of layers of graphene for both First Substrate/Wafer 1410 and Second Substrate/Wafer 1415. In a similar manner, Second Substrate/Wafer 1415 may be coated with a thin layer (50-100 nm) of Second Sacrificial Diffusion Layer 1435 and the thickness (volume) of Shared Carbon Source 1440 may be adjusted due to engineering considerations, especially with respect to but not exclusively due to how much carbon is required to form the desired number of layers of graphene for both First Substrate/Wafer 1410 and Second Substrate/Wafer 1415.

First Substrate/Wafer 1410 and Second Substrate/Wafer 1415 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. First Substrate/Wafer 1410 and Second Substrate/Wafer 1415 need not be similar.

First Substrate/Wafer 1410 and Second Substrate/Wafer 1415 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. First Substrate/Wafer 1410 and Second Substrate/Wafer 1415 may further comprise semiconductor devices such as resistors and capacitors and inductors, one or more programmable interconnects, solar cell structures, memory structures and devices, sensors, radio frequency devices, or optical interconnect with associated transceivers. First Substrate/Wafer 1410 and Second Substrate/Wafer 1415 may further include isolation layers, such as, for example, silicon and/or carbon containing oxides and/or low-k dielectrics and/or polymers, which may electrically isolate, for example, one layer from another layer. First Substrate/Wafer 1410 and Second Substrate/Wafer 1415 may be a wafer, for example, a monocrystalline silicon wafer, or a substrate, for example, a glass substrate.

With reference to at least FIG. 14A herein, an example process flow utilizing exemplary nominal synthesis chamber with a minimalist inverted multi-substrate load 1400 may be as follows. Preparation of First Substrate/Wafer 1410 and Second Substrate/Wafer 1415: A silicon wafer, which may have transistors and components already processed as discussed above herein, with a silicon oxide (nominally) as a top layer may be prepared as the substrate for graphene synthesis. Coating with First Sacrificial Diffusion Layer 1430 and Second Sacrificial Diffusion Layer 1435: The First Substrate/Wafer 1410 and Second Substrate/Wafer 1415 may be coated with the same or a different thin layer (50-100 nm or more) of transition metal such as Nickel using sputter or e-beam deposition techniques. First Substrate/Wafer 1410 may include a different thickness and/or transition metal than Second Substrate/Wafer 1415. Deposition of Shared Carbon Source 1440: Following the deposition of the First/Second Sacrificial Diffusion Layer 1430/1435, a 50-100 nm (or more) layer of amorphous or graphitic powder may be deposited onto the Ni coated either First Substrate/Wafer 1410 or Second Substrate/Wafer 1415 to form Shared Carbon Source 1440. Being shared, the amount of carbon source included in Shared Carbon Source 1440 may be adjusted appropriately. This carbon layer can be deposited, for example, using physical sputter, e-beam deposition, or spin-on techniques. High Pressure and Temperature Treatment: The prepared wafers, First Substrate/Wafer 1410 with First Sacrificial Diffusion Layer 1430 onboard, and Second Substrate/Wafer 1415 with Second Sacrificial Diffusion Layer 1435 and Shared Carbon Source 1440 onboard may be loaded into nominal synthesis chamber 1400 in the order and orientation shown in FIG. 14A: Second Substrate/Wafer 1415 with Second Sacrificial Diffusion Layer 1435 and Shared Carbon Source 1440 may be placed into a stack preparation device (not shown) face-up, meaning the backside of Second Substrate/Wafer 1415 is facing downwards and Shared Carbon Source 1440 is thusly facing upwards. Then, First Substrate/Wafer 1410 with First Sacrificial Diffusion Layer 1430 may be inverted and placed on top of the prepared second wafer. Thus, Shared Carbon Source 1440 is in direct contact with First Sacrificial Diffusion Layer 1430. This type of 'pair' may be repeated one or more times. As well, there could be pairs and singles in the load. The inverted multi-substrate load may be placed between the Top-Side Heater/Platen 1405 and the Bottom Side Heater/Platen 1407 and then aligned and lightly clamped. The temperature of the mixed inverted multi-substrate load may be allowed to stabilize and then, in this example, mechanical pressure may be applied to the substrate load via Top Bonding/Synthesis Force/Hydraulic Cylinder 1401. Generally, but not limited to, Bottom Bonding/Synthesis Force/Hydraulic Cylinder 1402 may be stationary in at least the direction towards the applied force of Top Bonding/Synthesis Force/Hydraulic Cylinder 1401. Force Indicators 1460 indicate the general average directionality of the compression forces experienced by the minimalist inverted multi-substrate load.

Under pressure and at elevated temperatures the formation of graphene layers accelerates. The carbon from Shared Carbon Source 1440 diffuses at least through the First Sacrificial Diffusion Layer 1430, accumulating on the other side of First Sacrificial Diffusion Layer 1430, specifically at the nickel-silicon oxide (Ni-SiOx) interface between First Sacrificial Diffusion Layer 1430 and First Substrate/Wafer 1410, thus carbon is diffusing 'upwards.' This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the Second prepared Substrate/Wafer 1415: the carbon from Shared Carbon Source 1440 diffuses through the Second Sacrificial Diffusion Layer 1435, accumulating on the other side of Second Sacrificial Diffusion Layer 1435, specifically at the nickel-silicon oxide (Ni-SiOx) interface between Second Sacrificial Diffusion Layer 1435 and Second Substrate/Wafer 1415, thus carbon is diffusing 'downwards.' This accumulation results in the formation of graphene.

The setup shown in FIG. 14A, of nominal synthesis chamber with a minimalist inverted multi-substrate load 1400, has, in the exemplary configuration shown in FIG. 14A, a double the nominal throughput surface of the nominal setup described in FIG. 11 herein. We will call this a throughput of 2 (wafers/hour) for a given graphene process at whatever temperature and pressure is chosen to form the SLG or MLG desired. However, nominal synthesis chamber with a minimalist inverted multi-substrate load 1400 may be loaded with more than 2 wafers/substrates per process 'shot.' The synthesis chamber could be loaded with multiples of the inverted doublet of prepared substrates/wafers (and any desired transition plates, not shown). Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1405 and the Bottom Side Heater/Platen 1407 and all the prepared substrates/wafers (and Transition Plates if utilized), much like an automotive internal combustion engine cylinder keeping the piston and rings aligned and centered when traveling the length of the piston cylinder. A longitudinal slot or slots may also provide a release mechanism. Thus, the 'throughput' of this configuration could be 3, 4 or 5, 6 or 8 or 10, 11 or 20 or 25 or 50 or 61 or 100 times that of the nominal FIG. 11 configuration. Accordingly, the number of prepared substrates/wafers per load may be 3, 4 or 5, 6 or 8 or 10, 11 or 20 or 25 or 50 or 61 or 100. And if the process, for example, takes 20 minutes/shot including any overhead, then the throughput per hour of a machine which may have one of these process chambers within it would be 3 times the number of prepared substrates/wafers per load; accordingly in wafers/substrates per hour a throughput may be 9, 12 or 15, 18 or 24 or 30, 33 or 60 or 75 or 150 or 183 or 300 wph (wafers per hour) by multiplying the example substrates/wafers per load number list just prior by 3 loads per hour (60 min/20 min/load=3 loads/hour). Odd numbers in this specific case of the inverted doublets with a shared carbon source only makes sense for maximal throughput if the odd wafer/substrate added on either end of the stack has a carbon source layer included, at least for the graphene synthesis example. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm.

Figure 14B:
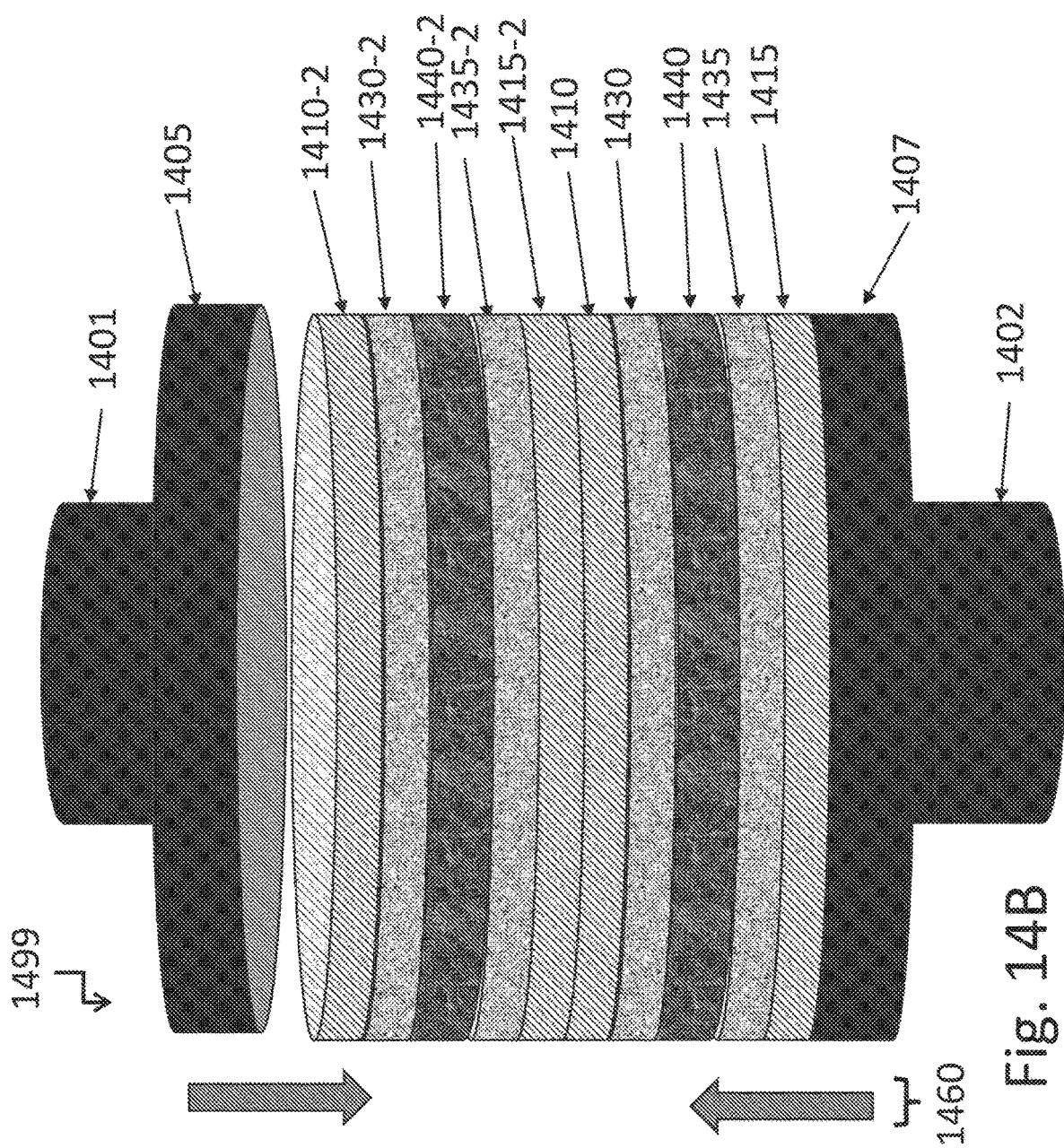
FIG. 14B illustrates an exemplary view a nominal synthesis chamber with an example double of doublet minimalist inverted multi-substrate load, according to some embodiments.

As illustrated in FIG. 14B, a nominal synthesis chamber with an example double of doublet minimalist inverted multi-substrate load 1499 may include at least Top Bonding/Synthesis Force/Hydraulic Cylinder 1401, Top-Side Heater/Platen 1405, $2^{nd}$ Doublet First Substrate/Wafer 1410-2, $2^{nd}$ Doublet First Sacrificial Diffusion Layer 1430-2, $2^{nd}$ Doublet Shared Carbon Source 1440-2, $2^{nd}$ Doublet Second Sacrificial Diffusion Layer 1435-2, $2^{nd}$ Doublet Second Substrate/Wafer 1415-2, First Substrate/Wafer 1410, First Sacrificial Diffusion Layer 1430, Shared Carbon Source 1440, Second Sacrificial Diffusion Layer 1435, Second Substrate/Wafer 1415, Bottom Side Heater/Platen 1407, and Bottom Bonding/Synthesis Force/Hydraulic Cylinder 1402, with Force Indicators 1460. The multi-substrate load for each process in the one chamber may include $2^{nd}$ Doublet First Substrate/Wafer 1410-2, $2^{nd}$ Doublet First Sacrificial Diffusion Layer 1430-2, $2^{nd}$ Doublet Shared Carbon Source 1440-2, $2^{nd}$ Doublet Second Sacrificial Diffusion Layer 1435-2, $2^{nd}$ Doublet Second Substrate/Wafer 1415-2, First Substrate/Wafer 1410, First Sacrificial Diffusion Layer 1430, Shared Carbon Source 1440, Second Sacrificial Diffusion Layer 1435, Second Substrate/Wafer 1415, thus processing at least four substrates/wafers for synthesis, such as graphene, in one shot, or processing step, where temperature and pressure may be applied to effect the synthesis, or other desired processing. A prepared substrate may include at least $2^{nd}$ Doublet First Substrate/Wafer 1410-2, $2^{nd}$ Doublet First Sacrificial Diffusion Layer 1430-2, and/or also a prepared substrate may include at least $2^{nd}$ Doublet Shared Carbon Source 1440-2, $2^{nd}$ Doublet Second Sacrificial Diffusion Layer 1435-2, $2^{nd}$ Doublet Second Substrate/Wafer 1415-2, and/or also a prepared substrate may include at least First Substrate/Wafer 1410, First Sacrificial Diffusion Layer 1430, and/or also a prepared substrate may include at least Shared Carbon Source 1440, Second Sacrificial Diffusion Layer 1435, Second Substrate/Wafer 1415.

The components within the substrate load for each process in the nominal synthesis chamber with a double of doublet minimalist inverted multi-substrate load 1499 may include many types of materials and substrates for various processes which may require temperature and pressure to complete. For this example and others herein, graphene synthesis will be utilized as the exemplary substrate load or loads for processing with temperature and pressure.

Accordingly, $2^{nd}$ Doublet Shared Carbon Source 1440-2 and Shared Carbon Source 1440 may include many materials and configurations in the substrate load, for example, such as a layer of deposited amorphous carbon, generally via PVD, CVD, or ALD processes, sputtered graphite, and so on. Many other examples of a carbon source for graphene synthesis may be found in at least the incorporated references.

$2^{nd}$ Doublet First Sacrificial Diffusion Layer 1430-2, $2^{nd}$ Doublet Second Sacrificial Diffusion Layer 1435-2, First Sacrificial Diffusion Layer 1430, and Second Sacrificial Diffusion Layer 1435, may include many materials and configurations in the substrate load, for example, such as a layer of deposited sputtered or e-beam Nickel or PVD, or low-temp CVD, other transition metals, and so on. Many other examples of a sacrificial diffusion layer for graphene synthesis may be found in at least the incorporated references. First Substrate/Wafer 1410 may be coated with a thin layer (50-100 nm) of First Sacrificial Diffusion Layer 1430 and the thickness (volume) of Shared Carbon Source 1440 may be adjusted due to engineering considerations, especially with respect to but not exclusively due to how much carbon is required to form the desired number of layers of graphene for both First Substrate/Wafer 1410 and Second Substrate/Wafer 1415. In a similar manner, Second Substrate/Wafer 1415 may be coated with a thin layer (50-100 nm) of Second Sacrificial Diffusion Layer 1435 and the thickness (volume) of Shared Carbon Source 1440 may be adjusted due to engineering considerations, especially with respect to but not exclusively due to how much carbon is required to form the desired number of layers of graphene for both First Substrate/Wafer 1410 and Second Substrate/Wafer 1415.

Similarly, $2^{nd}$ Doublet First Substrate/Wafer 1410-2 may be coated with a thin layer (50-100 nm) of $2^{nd}$ Doublet First Sacrificial Diffusion Layer 1430-2 and the thickness (volume) of $2^{nd}$ Doublet Shared Carbon Source 1440-2 may be adjusted due to engineering considerations, especially with respect to but not exclusively due to how much carbon is required to form the desired number of layers of graphene for both $2^{nd}$ Doublet First Substrate/Wafer 1410-2 and $2^{nd}$ Doublet Second Substrate/Wafer 1415-2. In a similar manner, $2^{nd}$ Doublet Second Substrate/Wafer 1415-2 may be coated with a thin layer (50-100 nm) of $2^{nd}$ Doublet Second Sacrificial Diffusion Layer 1435-2 and the thickness (volume) of $2^{nd}$ Doublet Shared Carbon Source 1440-2 may be adjusted due to engineering considerations, especially with respect to but not exclusively due to how much carbon is required to form the desired number of layers of graphene for both $2^{nd}$ Doublet First Substrate/Wafer 1410-2 and $2^{nd}$ Doublet Second Substrate/Wafer 1415-2.

$2^{nd}$ Doublet First Substrate/Wafer 1410-2, $2^{nd}$ Doublet Second Substrate/Wafer 1415-2, First Substrate/Wafer 1410, and Second Substrate/Wafer 1415 may include many materials and configurations in the substrate load, for example, such as a single crystal silicon wafer with transistors and other devices already formed, with the graphene synthesis process utilized to form MLG (Multi-Layer Graphene) interconnects between a portion of those transistors and other devices. Many other examples of a substrate/wafer for graphene synthesis, for example, such as transparent electrodes for solar cells, THz antennas for advanced cell phones, and so on, may be found in at least the incorporated references. $2^{nd}$ Doublet First Substrate/Wafer 1410-2, $2^{nd}$ Doublet Second Substrate/Wafer 1415-2, First Substrate/Wafer 1410, and Second Substrate/Wafer 1415 need not be similar.

$2^{nd}$ Doublet First Substrate/Wafer 1410-2, $2^{nd}$ Doublet Second Substrate/Wafer 1415-2, First Substrate/Wafer 1410 and Second Substrate/Wafer 1415 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers. The transistors may be junction-less transistors or recessed channel array transistors. $2^{nd}$ Doublet First Substrate/Wafer 1410-2, $2^{nd}$ Doublet Second Substrate/Wafer 1415-2, First Substrate/Wafer 1410, and Second Substrate/Wafer 1415 may further comprise semiconductor devices such as resistors and capacitors and inductors, one or more programmable interconnects, solar cell structures, memory structures and devices, sensors, radio frequency devices, or optical interconnect with associated transceivers. $2^{nd}$ Doublet First Substrate/Wafer 1410-2, $2^{nd}$ Doublet Second Substrate/Wafer 1415-2, First Substrate/Wafer 1410, and Second Substrate/Wafer 1415 may further include isolation layers, such as, for example, silicon and/or carbon containing oxides and/or low-k dielectrics and/or polymers, which may electrically isolate, for example, one layer from another layer. $2^{nd}$ Doublet First Substrate/Wafer 1410-2, $2^{nd}$ Doublet Second Substrate/Wafer 1415-2, First Substrate/Wafer 1410, and Second Substrate/Wafer 1415 may be a wafer, for example, a monocrystalline silicon wafer, or a substrate, for example, a glass substrate.

With reference to at least FIG. 14B herein, an example process flow utilizing exemplary nominal synthesis chamber with a double of doublet minimalist inverted multi-substrate load 1499 may be as follows. Preparation of $2^{nd}$ Doublet First Substrate/Wafer 1410-2, $2^{nd}$ Doublet Second Substrate/Wafer 1415-2, First Substrate/Wafer 1410, and Second Substrate/Wafer 1415: A silicon wafer, which may have transistors and components already processed as discussed above herein, with a silicon oxide (nominally) as a top layer may be prepared as the substrate for graphene synthesis. Coating with $2^{nd}$ Doublet First Sacrificial Diffusion Layer 1430-2, $2^{nd}$ Doublet Second Sacrificial Diffusion Layer 1435-2, First Sacrificial Diffusion Layer 1430, and Second Sacrificial Diffusion Layer 1435: The First Substrate/Wafer 1410 and Second Substrate/Wafer 1415 may be coated with the same or a different thin layer (50-100 nm or more) of transition metal such as Nickel using sputter or e-beam deposition techniques. First Substrate/Wafer 1410 may include a different thickness and/or transition metal than Second Substrate/Wafer 1415. As well, the $2^{nd}$ Doublet First Substrate/Wafer 1410-2 and $2^{nd}$ Doublet Second Substrate/Wafer 1415-2 may be coated with the same or a different thin layer (50-100 nm or more) of transition metal such as Nickel using sputter or e-beam deposition techniques. $2^{nd}$ Doublet First Substrate/Wafer 1410-2 may include a different thickness and/or transition metal than $2^{nd}$ Doublet Second Substrate/Wafer 1415-2. Deposition of $2^{nd}$ Doublet Shared Carbon Source 1440-2 and Shared Carbon Source 1440: Following the deposition of the First/Second Sacrificial Diffusion Layer 1430/1435, a 50-100 nm (or more) layer of amorphous or graphitic powder may be deposited onto the Ni coated First Substrate/Wafer 1410 and Second Substrate/Wafer 1415. This carbon layer can be deposited, for example, using physical sputter, e-beam deposition, or spin-on techniques. Moreover, following the deposition of the $2^{nd}$ Doublet First/Second Sacrificial Diffusion Layer 1430-2/1435-2, a 50-100 nm (or more) layer of amorphous or graphitic powder may be deposited onto the Ni coated $2^{nd}$ Doublet First Substrate/Wafer 1410-2 and $2^{nd}$ Doublet Second Substrate/Wafer 1415-2. This carbon layer can be deposited, for example, using physical sputter, e-beam deposition, or spin-on techniques. High Pressure and Temperature Treatment: The prepared wafers, may be loaded into nominal synthesis chamber 1499 in the order and orientation shown in FIG. 14B: Second Substrate/Wafer 1415 with Second Sacrificial Diffusion Layer 1435 and Shared Carbon Source 1440 may be placed into a stack preparation device (not shown) face-up, meaning the backside of Second Substrate/Wafer 1415 is facing downwards and Shared Carbon Source 1440 is thusly facing upwards. Then, First Substrate/Wafer 1410 with First Sacrificial Diffusion Layer 1430 may be inverted and placed on top of the prepared second wafer. Thus, Shared Carbon Source 1440 is in direct contact with First Sacrificial Diffusion Layer 1430. This type of 'pair' may be repeated one or more times. This is shown as $2^{nd}$ Doublet Second Substrate/Wafer 1415-2 with $2^{nd}$ Doublet Second Sacrificial Diffusion Layer 1435-2 and $2^{nd}$ Doublet Shared Carbon Source 1440-2 may be placed into a stack preparation device (not shown) face-up, meaning the backside of $2^{nd}$ Doublet Second Substrate/Wafer 1415-2 is facing downwards and $2^{nd}$ Doublet Shared Carbon Source 1440-2 is thusly facing upwards. Then, $2^{nd}$ Doublet First Substrate/Wafer 1410-2 with $2^{nd}$ Doublet First Sacrificial Diffusion Layer 1430-2 may be inverted and placed on top of the prepared second wafer. Thus, $2^{nd}$ Doublet Shared Carbon Source 1440-2 is in direct contact with $2^{nd}$ Doublet First Sacrificial Diffusion Layer 1430-2. Additionally, First Substrate/Wafer 1410 and $2^{nd}$ Doublet Second Substrate/Wafer 1415-2 may be directly contacting back-to-back, or may have a transition wafer/substrate (not shown) disposed between depending on the conditions and materials on the backside of each of First Substrate/Wafer 1410 and $2^{nd}$ Doublet Second Substrate/Wafer 1415-2 so that any potential unwanted reactions or 'bonding' may be prevented.

As well, there could be pairs and singles in the load. The inverted multi-substrate load may be placed between the Top-Side Heater/Platen 1405 and the Bottom Side Heater/Platen 1407 and then aligned and lightly clamped. The temperature of the mixed inverted multi-substrate load may be allowed to stabilize and then, in this example, mechanical pressure may be applied to the substrate load via Top Bonding/Synthesis Force/Hydraulic Cylinder 1401. Generally, but not limited to, Bottom Bonding/Synthesis Force/Hydraulic Cylinder 1402 may be stationary in at least the direction towards the applied force of Top Bonding/Synthesis Force/Hydraulic Cylinder 1401. Force Indicators 1460 indicate the general average directionality of the compression forces experienced by the double doublet minimalist inverted multi-substrate load.

Under pressure and at elevated temperatures the formation of graphene layers accelerates. The carbon from Shared Carbon Source 1440 diffuses at least through the First Sacrificial Diffusion Layer 1430, accumulating on the other side of First Sacrificial Diffusion Layer 1430, specifically at the nickel-silicon oxide (Ni-SiOx) interface between First Sacrificial Diffusion Layer 1430 and First Substrate/Wafer 1410, thus carbon is diffusing 'upwards.' This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the Second prepared Substrate/Wafer 1415: the carbon from Shared Carbon Source 1440 diffuses through the Second Sacrificial Diffusion Layer 1435, accumulating on the other side of Second Sacrificial Diffusion Layer 1435, specifically at the nickel-silicon oxide (Ni-SiOx) interface between Second Sacrificial Diffusion Layer 1435 and Second Substrate/Wafer 1415, thus carbon is diffusing 'downwards.' This accumulation results in the formation of graphene.

Similarly, the carbon from $2^{nd}$ Doublet Shared Carbon Source 1440-2 diffuses at least through the $2^{nd}$ Doublet First Sacrificial Diffusion Layer 1430-2, accumulating on the other side of $2^{nd}$ Doublet First Sacrificial Diffusion Layer 1430-2, specifically at the nickel-silicon oxide (Ni-SiOx) interface between $2^{nd}$ Doublet First Sacrificial Diffusion Layer 1430-2 and $2^{nd}$ Doublet First Substrate/Wafer 1410-2, thus carbon is diffusing 'upwards.' This accumulation results in the formation of graphene. The graphene formed can be single-layer (SLG) or multi-layer (MLG), depending on the process parameters and conditions. Gravity, the weakest of the fundamental forces, is a negligible effect on this process, so inversion does provide any meaningful difference in result. Similar formation will occur on the $2^{nd}$ Doublet Second prepared Substrate/Wafer 1415-2: the carbon from $2^{nd}$ Doublet Shared Carbon Source 1440-2 diffuses through the $2^{nd}$ Doublet Second Sacrificial Diffusion Layer 1435-2, accumulating on the other side of $2^{nd}$ Doublet Second Sacrificial Diffusion Layer 1435-2, specifically at the nickel-silicon oxide (Ni-SiOx) interface between $2^{nd}$ Doublet Second Sacrificial Diffusion Layer 1435-2 and $2^{nd}$ Doublet Second Substrate/Wafer 1415-2, thus carbon is diffusing 'downwards.' This accumulation results in the formation of graphene.

The setup shown in FIG. 14B, of nominal synthesis chamber with a double doublet minimalist inverted multi-substrate load 1499, has, in the exemplary configuration shown in FIG. 14B, a quadruple of the nominal throughput surface of the nominal setup described in FIG. 11 herein. We will call this a throughput of 4 (wafers/hour) for a given graphene process at whatever temperature and pressure is chosen to form the SLG or MLG desired. However, nominal synthesis chamber with a double doublet minimalist inverted multi-substrate load 1499 may be loaded with more than 4 wafers/substrates per process 'shot.' The synthesis chamber could be loaded with multiples of the double inverted doublet of prepared substrates/wafers (and any desired transition plates, not shown). Since substrate to substrate or wafer-to-wafer alignment does not need to be at the nanometer level for the SLG/MLG synthesis process, adequate alignment may be provided by many simple means; for example, such as a cylinder enclosing/fitting the perimeters of Top-Side Heater/Platen 1405 and the Bottom Side Heater/Platen 1407 and all the prepared substrates/wafers (and Transition Plates if utilized), much like an automotive internal combustion engine cylinder keeping the piston and rings aligned and centered when traveling the length of the piston cylinder. A longitudinal slot or slots may also provide a release mechanism. Thus, the 'throughput' of this configuration could be 4, 8 or 9, 12 or 16 or 20, 24 or 28 or 32 or 40 or 64 or 100 times that of the nominal FIG. 11 configuration. Accordingly, the number of prepared substrates/wafers per load may be 4, 8 or 9, 12 or 16 or 20, 24 or 28 or 32 or 40 or 64 or 100. And if the process, for example, takes 20 minutes/shot including any overhead, then the throughput per hour of a machine which may have one of these process chambers within it would be 3 times the number of prepared substrates/wafers per load; accordingly in wafers/substrates per hour a throughput may be 12, 24 or 25, 36 or 48 or 60, 72 or 84 or 96 or 120 or 192 or 300 wph (wafers per hour) by multiplying the example substrates/wafers per load number list just prior by 3 loads per hour (60 min/20 min/load=3 loads/hour). Odd numbers in this specific case of the inverted doublets with a shared carbon source only makes sense for maximal throughput if the odd wafer/substrate added on either end of the stack has a carbon source layer included, at least for the graphene synthesis example. Stacking and unstacking of the substrate/wafer stack can be done off-line and thus not appreciably affect the synthesis throughput number. Mis-alignment between substrates in the stack can be less than about 2.0 mm, less than about 1.5 mm, less than about 1 mm, less than about 0.5 mm, less than about 0.25 mm, or less than about 0.1 mm

CONCLUSION

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

We claim:

1. A diffusion-couple synthesis method using a graphene synthesis tool, the method comprising:
    providing a substrate load,
        wherein said substrate load comprises at least a first prepared substrate and a second prepared substrate,
        wherein said first prepared substrate comprises a first carbon source, a first sacrificial diffusion layer, and a first device level,
        wherein a first dielectric layer is disposed atop said first device level,
        wherein said first device level comprises first transistors,
        wherein said first sacrificial diffusion layer is disposed directly atop said first dielectric layer,
        wherein said first carbon source is disposed directly atop said first sacrificial diffusion layer, and
        wherein said second prepared substrate comprises a second carbon source, a second sacrificial diffusion layer, and a second device level,
        wherein a second dielectric layer is disposed atop said second device level,
        wherein said second device level comprises second transistors,
        wherein said second sacrificial diffusion layer is disposed directly atop said second dielectric layer,
        wherein said second carbon source is disposed directly atop said second sacrificial diffusion layer;
    providing a graphene synthesis tool,
        wherein said graphene synthesis tool is capable of applying pressure and temperature to said substrate load within a process chamber;
    placing said substrate load within said process chamber;
    applying said pressure and said temperature to said substrate load,
        wherein said second prepared substrate is inverted and disposed above said first prepared substrate,
        wherein said first carbon source is in direct contact with said second carbon source; and
    forming graphene at a first interface between said first dielectric layer and said first sacrificial diffusion layer and at a second interface between said second dielectric layer and said second sacrificial diffusion layer,
        wherein first carbon of said first carbon source diffuses in a net opposite direction to second carbon of said second carbon source.

2. The method of claim 1,
    wherein said first sacrificial diffusion layer and said second sacrificial diffusion layer comprise nickel or cobalt.

3. The method of claim 1,
    wherein said first sacrificial diffusion layer and said second sacrificial diffusion layer comprise nickel or cobalt, and
    wherein said first carbon source and said second carbon source comprise amorphous carbon or a graphitic powder.

4. The method of claim 1,
    wherein said first prepared substrate and said second prepared substrate each comprise a silicon wafer of a 450 mm diameter, a 300 mm diameter, a 200 mm diameter, or a 150 mm diameter.

5. The method of claim 1,
    wherein said first dielectric layer and said second dielectric layer comprise silicon dioxide or HBN.

6. The method of claim 1,
    wherein said graphene is a high-quality atomically-thin film, and
    wherein high quality is a Raman g/d peak ratio greater than 1.0.

7. The method of claim 1,
    wherein said substrate load comprises at least one transition plate.

8. The method of claim 1,
    wherein said graphene is integrated in a complementary metal-oxide-semiconductor (CMOS) microelectronics device.

9. The method of claim 1,
    wherein said pressure is 30 psi to 1000 psi applied to said substrate load, and wherein said temperature is greater than 25° C. and less than 500° C.

10. A diffusion-couple synthesis method using a graphene synthesis tool, the method comprising:
    providing a substrate load,
        wherein said substrate load comprises at least a first prepared substrate and a second prepared substrate,
        wherein said first prepared substrate comprises a first carbon source, a first sacrificial diffusion layer, and a first device level,
        wherein a first dielectric layer is disposed atop said first device level,
        wherein said first device level comprises first transistors,
        wherein said first sacrificial diffusion layer is disposed directly atop said first dielectric layer,
        wherein said first carbon source is disposed directly atop said first sacrificial diffusion layer, and
        wherein said second prepared substrate comprises a second sacrificial diffusion layer and a second device level,
        wherein a second dielectric layer is disposed atop said second device level,
        wherein said second device level comprises second transistors,
        wherein said second sacrificial diffusion layer is disposed directly atop said second dielectric layer;
    providing a graphene synthesis tool,
        wherein said graphene synthesis tool is capable of applying pressure and temperature to said substrate load within a process chamber;
    placing said substrate load within said process chamber;
    applying said pressure and said temperature to said substrate load,
        wherein said second prepared substrate is inverted and disposed above said first prepared substrate,
        wherein said first carbon source is in direct contact with said second sacrificial diffusion layer; and diffusing carbon of said first carbon source in a first direction to thereby form graphene at a first interface between said first dielectric layer and said first sacrificial diffusion layer; and simultaneously diffusing said carbon of said first carbon source in a second direction to thereby form graphene at a second interface between said second dielectric layer and said second sacrificial diffusion.

11. The method of claim 10,
wherein said first sacrificial diffusion layer and said second sacrificial diffusion layer comprise nickel or cobalt.

12. The method of claim 10,
wherein said first sacrificial diffusion layer and said second sacrificial diffusion layer comprise nickel or cobalt, and
wherein said first carbon source comprises amorphous carbon or a graphitic powder.

13. The method of claim 10,
wherein said first prepared substrate and said second prepared substrate each comprise a silicon wafer of a 450 mm diameter, a 300 mm diameter, a 200 mm diameter, or a 150 mm diameter.

14. The method of claim 10,
wherein said first dielectric layer and said second dielectric layer comprise silicon dioxide or HBN.

15. The method of claim 10,
wherein said graphene is a high-quality atomically-thin film, and
wherein high quality is a Raman spectra g/d peak ratio greater than 1.0.

16. The method of claim 10,
wherein said graphene synthesis tool comprises a scaled-up diffusion-couple apparatus, a wafer bonding tool, a hot-press based isostatic sintering system, a hot isostatic press (HIP), or a hot pressure vessel, and
wherein said graphene synthesis tool is modified or unmodified from its original design.

17. The method of claim 10,
wherein said graphene is integrated in a complementary metal-oxide-semiconductor (CMOS) microelectronics device.

18. The method of claim 10,
wherein said pressure is 30 psi to 1000 psi applied to said substrate load, and
wherein said temperature is greater than 25° C. and less than 500° C.

19. A diffusion-couple synthesis method using a graphene synthesis tool, the method comprising:
providing a substrate load,
wherein said substrate load comprises a prepared substrate;
providing a graphene synthesis tool,
wherein said graphene synthesis tool is capable of applying pressure and temperature to said substrate load within a process chamber;
placing said substrate load within said process chamber;
applying said pressure and said temperature to said substrate load,
wherein said prepared substrate comprises a diffusion layer and a device level,
wherein a dielectric layer is disposed atop said device level,
wherein said diffusion layer is disposed directly atop said dielectric layer,
wherein a single layer of carbon source is disposed directly atop said diffusion layer of said prepared substrate,
wherein said single layer of carbon source is in direct contact with said sacrificial diffusion layer of said prepared substrate; and
forming graphene at an interface between said dielectric layer and said diffusion layer of said prepared substrate,
wherein said substrate load comprises at least three additional prepared substrates, and
wherein pairs of said prepared substrates comprise one prepared substrate facing up and one prepared substrate inverted.

* * * * *